(12) United States Patent
Yamazaki et al.

(10) Patent No.: US 7,670,935 B2
(45) Date of Patent: Mar. 2, 2010

(54) MANUFACTURING METHOD OF SEMICONDUCTOR DEVICE

(75) Inventors: Shunpei Yamazaki, Setagaya (JP); Akihisa Shimomura, Atsugi (JP); Hisashi Ohtani, Atsugi (JP); Masaaki Hiroki, Atsugi (JP); Koichiro Tanaka, Atsugi (JP); Aiko Shiga, Atsugi (JP); Mai Akiba, Atsugi (JP); Kenji Kasahara, Tsukuba (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1008 days.

(21) Appl. No.: 11/354,885

(22) Filed: Feb. 16, 2006

(65) Prior Publication Data

US 2006/0134886 A1 Jun. 22, 2006

Related U.S. Application Data

(62) Division of application No. 10/882,343, filed on Jul. 2, 2004, now Pat. No. 7,279,372, which is a division of application No. 10/315,204, filed on Dec. 10, 2002, now Pat. No. 6,764,886.

(30) Foreign Application Priority Data

Dec. 11, 2001 (JP) ............................. 2001-376707

(51) Int. Cl.
H01L 21/20 (2006.01)
(52) U.S. Cl. .................... 438/486; 257/59; 438/487; 349/42; 349/43
(58) Field of Classification Search ............ 257/59, 257/E27.1, E29.151, E21.134; 438/486, 438/487; 349/42, 43
See application file for complete search history.

(56) References Cited

U.S. PATENT DOCUMENTS 4,409,724 A 10/1983 Tasch, Jr. et al.

(Continued)

FOREIGN PATENT DOCUMENTS

CN 1304548 7/2001

(Continued)

OTHER PUBLICATIONS

Search Report (Application No. 200603966-3) Dated May 11, 2009.

(Continued)

*Primary Examiner*—David Vu
*Assistant Examiner*—Brandon Fox
(74) *Attorney, Agent, or Firm*—Eric J. Robinson; Robinson Intellectual Property Law Office, P.C.

(57) ABSTRACT

Island-like semiconductor films and markers are formed prior to laser irradiation. Markers are used as positional references so as not to perform laser irradiation all over the semiconductor within a substrate surface, but to perform a minimum crystallization on at least indispensable portion. Since the time required for laser crystallization can be reduced, it is possible to increase the substrate processing speed. By applying the above-described constitution to a conventional SLS method, a means for solving such problem in the conventional SLS method that the substrate processing efficiency is insufficient, is provided.

24 Claims, 14 Drawing Sheets

U.S. PATENT DOCUMENTS

| | | | |
|---|---|---|---|
| 5,409,867 A | 4/1995 | Asano | |
| 5,580,801 A | 12/1996 | Maegawa et al. | |
| 5,643,826 A | 7/1997 | Ohtani et al. | |
| 5,795,816 A | 8/1998 | Teramoto et al. | |
| 5,815,494 A | 9/1998 | Yamazaki et al. | |
| 5,817,548 A | 10/1998 | Noguchi et al. | |
| 5,851,862 A | 12/1998 | Ohtani et al. | |
| 6,066,516 A | 5/2000 | Miyasaka | |
| 6,136,632 A | 10/2000 | Higashi | |
| 6,235,614 B1 | 5/2001 | Yang | |
| 6,265,290 B1 | 7/2001 | Moon et al. | |
| 6,373,870 B1 | 4/2002 | Yamazaki et al. | |
| 6,489,188 B2 | 12/2002 | Jung | |
| 6,558,991 B2 | 5/2003 | Yamazaki et al. | |
| 6,566,683 B1 | 5/2003 | Ogawa et al. | |
| 6,602,744 B1 | 8/2003 | Ino et al. | |
| 6,642,091 B1 | 11/2003 | Tanabe | |
| 6,657,154 B1 | 12/2003 | Tanabe et al. | |
| 6,700,096 B2 | 3/2004 | Yamazaki et al. | |
| 6,753,548 B2 | 6/2004 | Ogawa et al. | |
| 6,759,628 B1 | 7/2004 | Ino et al. | |
| 6,809,013 B2 * | 10/2004 | Ito | 438/487 |
| 6,830,617 B1 | 12/2004 | Ohtani et al. | |
| 6,863,733 B1 | 3/2005 | Tanabe | |
| 6,989,300 B1 | 1/2006 | Tanabe | |
| 2001/0000243 A1 | 4/2001 | Sugano et al. | |
| 2002/0045288 A1 | 4/2002 | Yamazaki et al. | |
| 2002/0068391 A1 | 6/2002 | Jung | |
| 2002/0096680 A1 | 7/2002 | Sugano et al. | |
| 2003/0064551 A1 * | 4/2003 | Voutsas | 438/150 |
| 2003/0089907 A1 | 5/2003 | Yamaguchi et al. | |
| 2003/0148594 A1 | 8/2003 | Yamazaki et al. | |
| 2003/0153182 A1 | 8/2003 | Yamazaki et al. | |
| 2003/0153999 A1 | 8/2003 | Miyanaga et al. | |
| 2003/0171837 A1 | 9/2003 | Yamazaki et al. | |
| 2003/0201466 A1 | 10/2003 | Ogawa et al. | |
| 2003/0211714 A1 | 11/2003 | Yamazaki et al. | |
| 2003/0228723 A1 | 12/2003 | Yamazaki et al. | |
| 2003/0235971 A1 | 12/2003 | Yamazaki et al. | |
| 2004/0060515 A1 | 4/2004 | Tanabe et al. | |
| 2004/0132266 A1 | 7/2004 | Yamazaki et al. | |
| 2005/0037554 A1 | 2/2005 | Ohtani et al. | |

FOREIGN PATENT DOCUMENTS

| | | |
|---|---|---|
| EP | 0 047 140 | 3/1982 |
| EP | 0 646 950 | 4/1995 |
| EP | 1 087 429 | 3/2001 |
| GB | 2 354 111 | 3/2001 |
| JP | 06-289431 A | 10/1994 |
| JP | 07-130652 | 5/1995 |
| JP | 07-193247 | 7/1995 |
| JP | 08-078329 | 3/1996 |
| JP | 09-045616 | 2/1997 |
| JP | 09-219380 | 8/1997 |
| JP | 09-320961 | 12/1997 |
| JP | 10-012891 | 1/1998 |
| JP | 10-135468 | 5/1998 |
| JP | 10-135469 | 5/1998 |
| JP | 2001-036089 | 2/2001 |
| JP | 2003-229432 | 8/2003 |
| KR | 2001-0029934 A | 4/2001 |

OTHER PUBLICATIONS

James S. Im and H.J. Kim, "On the Super Lateral Growth Phenomenon Observed in Excimer Laser-Induced Crystallization of Thin Si Films," Appl. Phys. Lett. 64 (17), Apr. 25, 1994, pp. 2303-2305.

Robert S. Sposili and James S. Im, "Sequential Lateral Solidification of Thin Silicon Films on $SiO_2$," Appl. Phys. Lett. 69 (19), Nov. 4, 1996, pp. 2864-2866.

Australian Patent Office Search Report dated Sep. 6, 2004 for Application No. SG 200207340-1.

European Patent Office Search Report dated Feb. 21, 2005 for Application No. EP 02026824.9.

Result of Consultation dated Nov. 7, 2006 for Application No. 02 026 824.9.

Im.J et al., "Phase Transformation Mechanisms Involved in Excimer Laser Crystallization of Amorphous Silicon Films," Appl. Phys. Lett. (Applied Physics Letters), Oct. 4, 1993, vol. 63, No. 14, pp. 1969-1971.

* cited by examiner

RELATIVE SHIFT DIRECTION OF LASER BEAM SPOT WITH RESPECT TO SUBSTRATE

RELATIVE SHIFT DIRECTION OF LASER BEAM SPOT WITH RESPECT TO SUBSTRATE

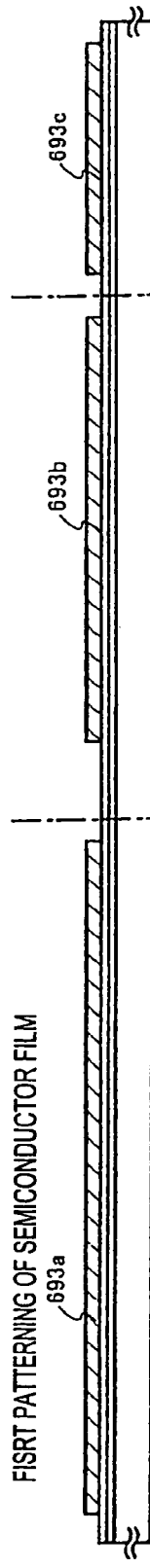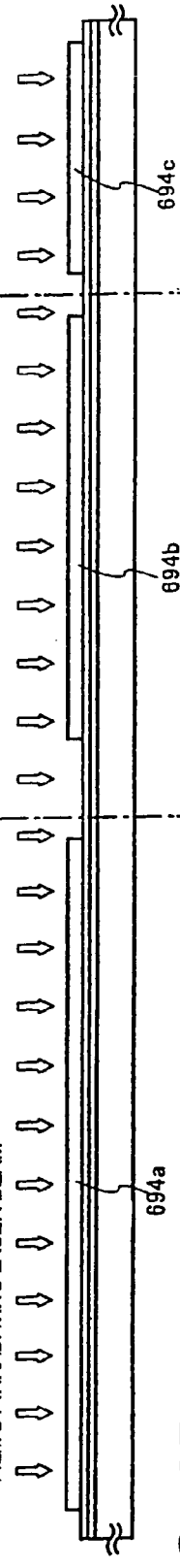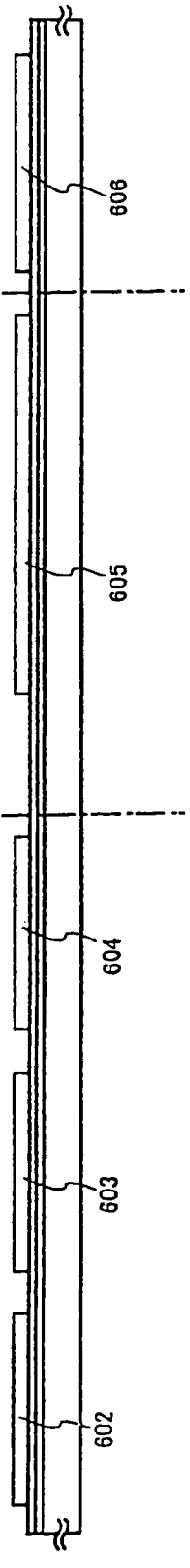
FIG. 6A FORMATION OF BASE INSULATING FILM / FORMATION OF SEMICONDUCTOR FILM
FIG. 6B FIRST PATTERNING OF SEMICONDUCTOR FILM
FIG. 6C CRYSTALLIZATION OF PATTERNED SEMICONDUCTOR FILM BY IRRADIATING LASER BEAM
FIG. 6D FORMATION OF ISLAND-LIKE SEMICONDUCTOR FILM BY PATTERNING

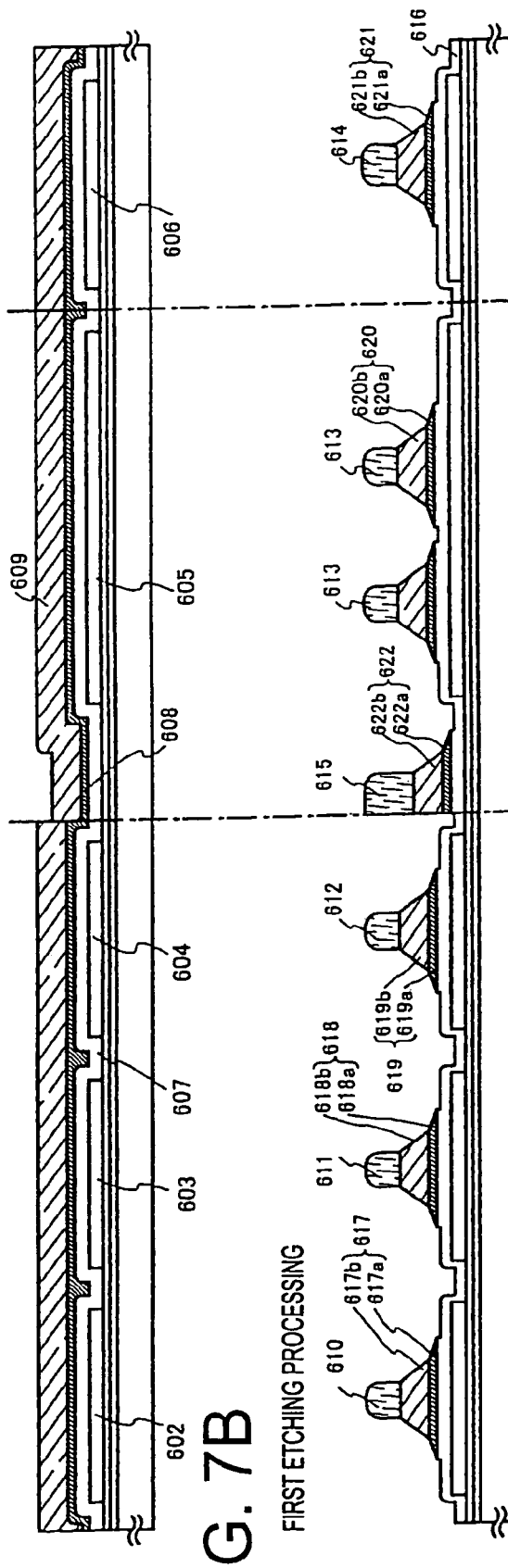

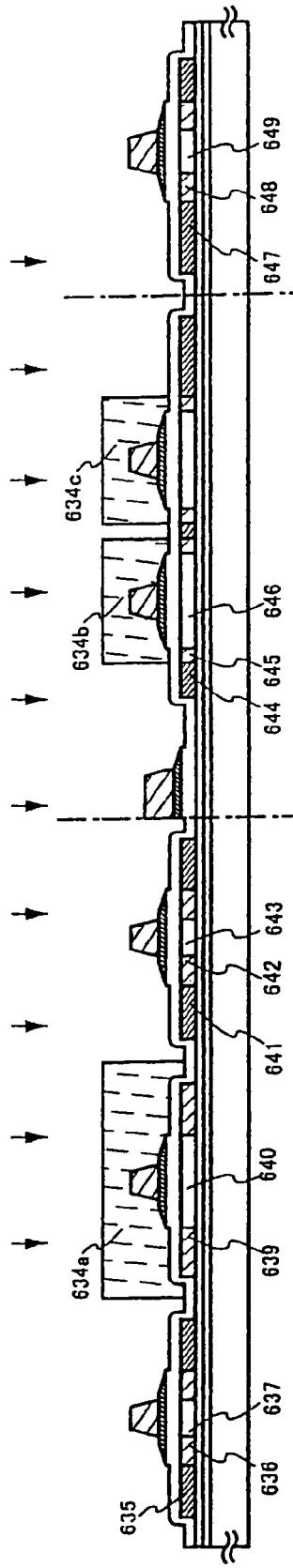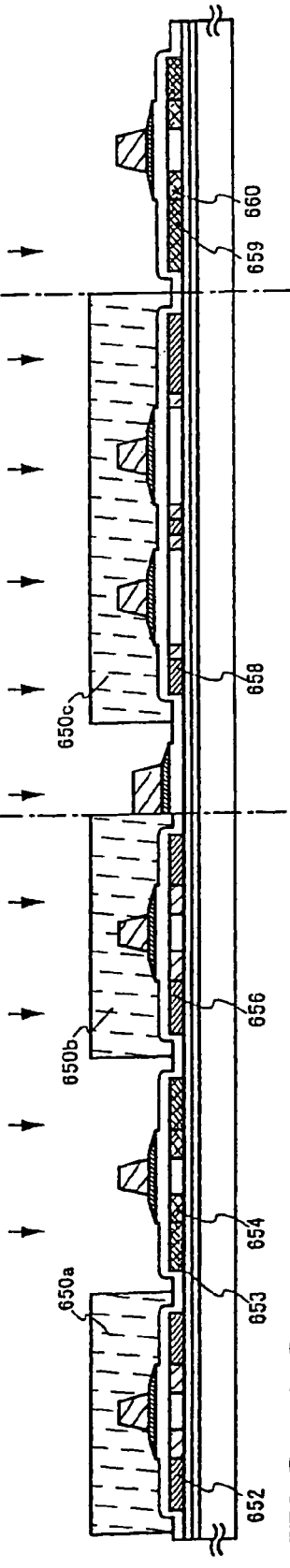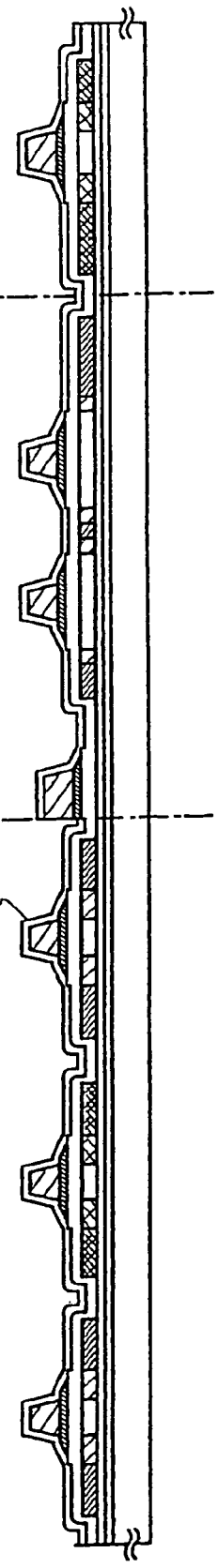

LASER BEAM SCANNING DIRECTION
←

SEM OBSERVATION AFTER LASER CRYSTALLIZATION (X15K)
(CRYSTAL GRAIN BOUNDARY IS VISUALIZED IN A MANNER OF SECCO ETCHING)

DISTANCE CORRESPONDING TO FEED PITCH 3 μM

ILLUSTRATIONS SHOWING CRYSTAL GRAIN BOUNDARY OF FIG. 11A

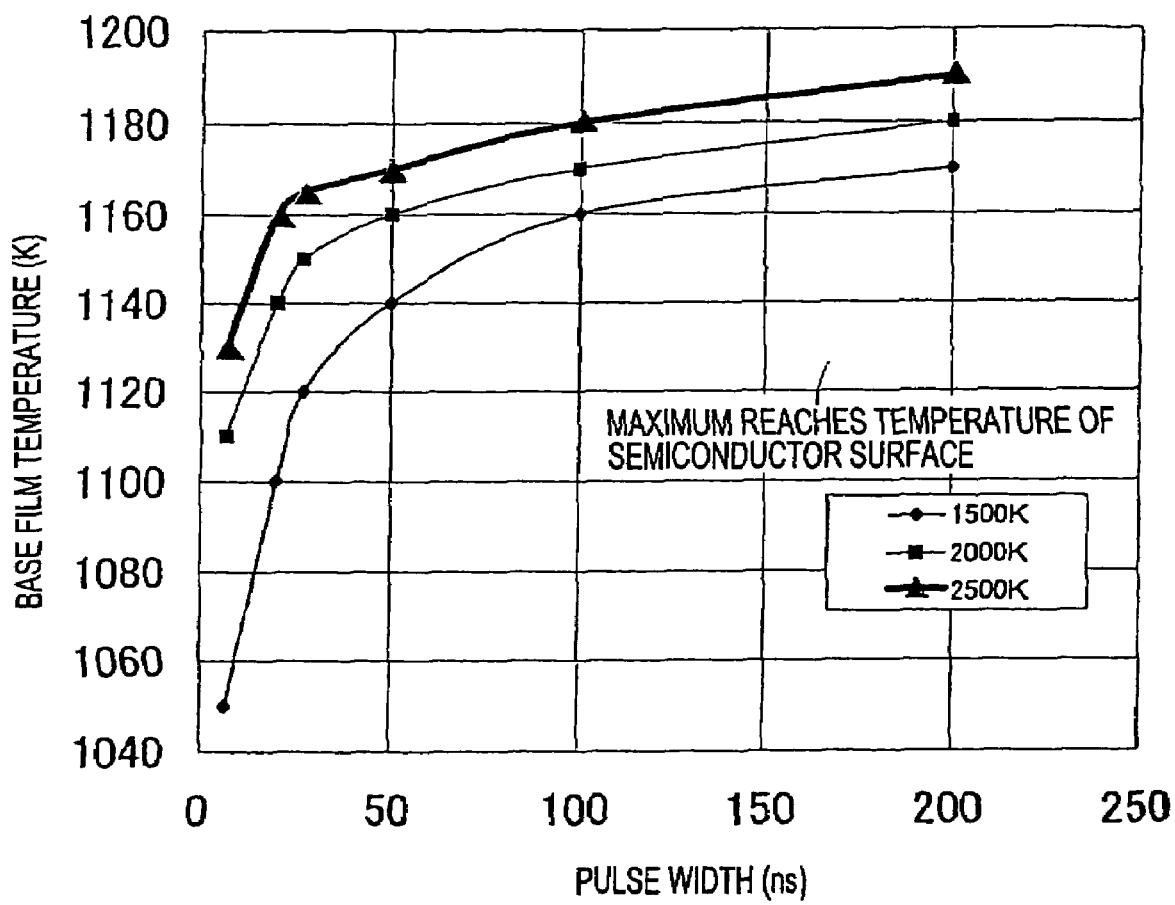

MANUFACTURING METHOD OF SEMICONDUCTOR DEVICE

BACKGROUND OF THE INVENTION

1. Field of the Invention

The present invention relates to a manufacturing method of semiconductor device having thin film transistor, particularly to a technique for forming crystalline semiconductor film, which comprises active layer of thin film transistor.

2. Related Art

As a forming method of active layer on thin film transistor (Thin Film Transistor: hereinafter, referred to as TFT), a technique, in which an amorphous semiconductor film is formed on a substrate having an insulation surface, and then, crystallize the same in a manner of laser annealing or heat annealing, has been developed.

The laser annealing is known as a crystallization technique, in which a high energy is given to an amorphous semiconductor film only without allowing the temperature of a glass substrate to rise too high, and thereby, the amorphous semiconductor film is crystallized. Particularly, excimer laser is a typical laser, which oscillates short-wave length light of 400 nm or less in wavelength, has been used since the laser annealing was developed. The laser annealing is carried out in such a manner that a laser beam is processed by means of an optical system so as to be shaped into a spot-like form or a linear form at a surface to be irradiated, and the surface to be irradiated on the substrate is scanned by the processed laser beam; i.e., irradiation position of the laser beam is shifted with respect to the surface to be irradiated.

However, the crystalline semiconductor film, which is prepared by means of the laser annealing, comprises an aggregate of a plurality of crystal grain (ordinary crystal grain size, which is prepared by means of a conventional excimer laser crystallization, is approximately 0.1-0.5 μm), and, the position and the size of the crystal grain are not even.

As for the TFT, which is prepared on a glass substrate, in order to isolate elements, since the crystalline semiconductor film is formed being separated into island-like patterns, it was impossible to form crystal grains at specified positions and sizes. Accordingly, it was almost impossible to form channel-forming areas with a monocrystal semiconductor while eliminating the influences of the crystal grain boundary.

The interface (crystal grain boundary) of the crystal grain is an area where the translational symmetry of the crystal is decayed. It is known that, due to the influence of the recombination center or trapping center of the carrier, or the influence of the potential barrier in the crystal grain boundary caused from the crystal defect or the like, the current transport characteristics of the carrier is decreased, and as a result, the OFF-current increases in the TFT.

A technique called as super lateral growth, by which, compared to the crystal grain size via conventional excimer laser crystallization, a larger grain size can be formed, is known. A detailed description of the technique is disclosed in "On the super lateral growth phenomenon observed in excimer laser-induced crystallization of thin Si films, James S. Im. and H. J. Kim, Appl. Phys. Lett. 64(17), Apr. 25, 1996, pp 2303-2305".

In the super lateral growth, a portion, where the semiconductor is melted completely due to the irradiation of a laser beam, and a portion where the solid-phase semiconductor area remains, are formed, and then, the crystal growth begins around the solid-phase semiconductor area as the crystal nucleus. Since it takes a certain period of time for nucleation to take place in the completely melted area, during the period of time until the nucleation takes place in the completely melted area, the crystal grows around the above-described solid-phase semiconductor area as the crystal nucleus in the horizontal direction (hereinafter, referred to as lateral direction) with respect to the film surface of the above-described semiconductor. Therefore, the crystal grain grows up to a length as long as several tens of times of the film thickness. For example, with respect to the silicon film thickness of 60 nm, a lateral crystal growth of 1 μm-2 μm in length takes place. Hereinafter, the phenomenon will be referred to as super lateral growth.

In the case of the above-described super lateral growth, although a relatively large crystal grain can be obtained, the energy intensity area of the laser beam, where the super lateral growth is obtained, is much stronger than the intensity that is used in ordinary excimer laser crystallization. Also, the range of the energy intensity area is extremely narrow. From the viewpoint of the position control of the crystal grain, it is impossible to control the position where a large crystal grain is obtained. Further, the area other than that of the large crystal grain is the microcrystal area where countless nucleation has taken place, or the amorphous area; the size of the crystals is not even and the roughness of the crystal surface is extremely large.

Accordingly, the irradiation condition, which is generally used in manufacturing of semiconductor devices, is the condition where even crystal grain size of approximately 0.1 μm-0.5 μm can be obtained.

Further, according to "Sequential lateral solidification of thin silicon films on $SiO_2$, Robert S. Sposili and James S. Im, Appl. Phys. Lett. 69(19), Nov. 4, 1996, pp 2864-2866", James S. Im et al. disclosed a Sequential Lateral Solidification method (hereinafter, referred to as SLS method), in which, by controlling artificially, the super lateral growth can be obtained at a desired position. According to the SLS method, an excimer laser beam of pulse oscillation is irradiated to a material via a slit-like mask. According to the SLS method, the crystallization is carried out while the relative position between the material and the laser beam is displaced, at every shot, by a distance (approximately 0.75 μm), which is roughly equivalent to the length of the crystal formed via the super lateral growth; thereby, the crystal is allowed to grow by means of artificially controlled super lateral growth.

As described above, by using the SLS method it is possible to prepare crystal grains at desired positions under artificially controlled conditions, in a manner of the super lateral growth. However, the SLS method has the following problems as described below.

First of all, the problem is that the substrate processing efficiency (throughput) is insufficient. As described previously, in the SLS method, the crystallization distance per shot of laser beam is approximately 1 μm. Accordingly, it is necessary that the relative shift distance (feed pitch) of the laser beam between the beam spot on the material surface and the material substrate is 1 μm or less. In the conditions adopted in the ordinary laser crystallization using a pulse oscillation excimer laser, feed pitch per shot of laser beam is several 10 μm or more. Needless to say, under such conditions, the crystal peculiar to the SLS method can not be prepared. In the SLS method, although a pulse oscillation XeCl excimer laser is used, the maximum oscillation frequency of the pulse oscillation XeCl excimer laser is 300 Hz. Under such conditions, only the crystallization area of maximum 300 μm or so is processed in distance in the scan direction of the laser beam. At the processing speed as described above, in the case of a large size substrate such as, for example, 600 mm×720 mm in dimension, with the SLS method, it takes an extremely long period of time to process one sheet of substrate.

The fact that it takes a long processing time per sheet of substrate is not only the problem of time and cost. That is to say, practically, in the case of crystallization of an amorphous semiconductor film, the surface processing thereof is critical. For example, in the case that laser irradiation is carried out after removing natural oxide film with dilute hydrofluoric acid or the like as a pre-processing, in the surface of the substrate, compared to the area where is subjected to the laser irradiation at the first, there is a possibility that natural oxide film grows again in the area where is subjected to the laser irradiation at the last. In this case, amount of Carbon, Oxygen, Nitrogen, or amount of contamination impurities such as Boron or the like, which is taken in the finished crystal, may vary within the surface of the substrate resulting in an unevenness of the transistor characteristics within the surface of the substrate.

Secondly, such a problem that the optical system tends to be complicated remains in the conventional SLS method. It is necessary to incorporate a mask, which processes slit-like the configuration of the laser beam power at the substrate surface, into the optical system. Ordinarily, film thickness of an active layer silicon, which is used for polycrystalline silicon thin film transistor, is several tens nm or more. When a pulse oscillation excimer laser is used, the laser energy density necessary for the laser crystallization is at least 200 mJ/cm$^2$ (as a typical example, for an amorphous silicon film of 50 nm, approximately 400 mJ/cm$^2$ with an XeCl excimer laser of 30 nsec pulse width). In the SLS method, there is a super lateral growth condition, which is the optimum for a further slightly stronger energy density area. It is difficult to prepare a slit-like form mask, which is capable of enduring such strong laser energy density. In the case of the mask of metal material, being subjected to the pulse laser beam irradiation of a strong energy density, the temperature of local film is raised and cooled down rapidly. As a result, it may cause a peeling or decay of configuration of a minute pattern due to a long period of use (as for photo lithography for resist exposure, although a hard mask material such as chromium or the like is used, since incomparably weaker energy density than the laser energy density necessary for silicon crystallization is used, there is no problem such as peeling or a decay of configuration of the minute pattern). As described above, there is such a factor that optical system becomes complicated resulting in a difficulty of maintenance of an apparatus in the conventional SLS method. Further, in order to carry out the super lateral growth, it is necessary to make the spatial beam power profile of the laser beam sharp (to eliminate attenuation area of the optical power between the irradiation area and the non-irradiation area of the laser beam). In the conventional SLS method, since the beam necessary for the super lateral growth cannot be condensed using the ordinarily optical system only, the excimer laser is used. Accordingly, it is understood that a slit-like mask is required to shield the laser beam partially.

The object of the invention is to solve the above-described problem, and further, to increase the positional control of crystal grains in accordance with the layout of the TFT, and simultaneously, to increase the processing speed of the crystallization process. More particularly, it is an object of the invention to provide a manufacturing method of semiconductor devices, which is capable of forming large size crystal grains successively in a manner of super lateral growth under an artificial control, and capable of increasing the substrate processing efficiency in the laser crystallization process.

Further, the invention provides a manufacturing method of semiconductor devices which is capable of forming large size crystal grains successively in a manner of super lateral growth under an artificial control, and capable of increasing the substrate processing efficiency in the laser crystallization process, as well as to provide a manufacturing method using a convenient laser irradiation method which does not need to incorporate a mask, which processes the configuration of the laser beam power into a slit-like shape on the substrate surface, into an optical system unlike the conventional SLS method.

SUMMARY OF THE INVENTION

A laser irradiator applied to the invention includes a first means for controlling the irradiation position of laser beam with respect to an object to be processed (substrate and thin film formed on the substrate); a second means (laser oscillator) for oscillating the laser beam; a third means (optical system) for processing the laser beam; and a fourth means for controlling the oscillation of the second means, and for controlling the first means so that the beam spot of the laser beam, which is processed by the third means, covers the specified position in accordance with data (pattern information) of photomask configuration.

As the first means for controlling irradiation position of the laser beam with respect to the object to be processed, two methods are available. One of the methods is a method in which the position of the object to be processed placed on the stage is changed by driving the stage by means of a stage controller. The other one is a method in which the irradiation position of the laser beam spot is shifted using a laser optical system in a state that the substrate position is fixed. In the invention, any one of the above-described two methods is applicable; and a method, in which the above-described two methods are combined, is also applicable.

The position specified in accordance with the data (pattern information) of photomask configuration is the portion in a semiconductor film, which becomes a channel area, a source area or a drain area in the thin film transistor, and is obtained by carrying out patterning processing by means of photo lithography technique on an island-like semiconductor layer B after crystallization.

Also, in the invention, before the laser beam irradiation, it is necessary to subject the semiconductor to an patterning processing on an island-like semiconductor film A, which is specific area including an active layer forming area comprised of thin film transistor by means of photo lithography technique, and to form markers on parts of semiconductor film. The marker is necessary to realize the above-described fourth means. Further, the island-like semiconductor layer A is slightly larger than the island-like semiconductor layer B. FIG. 2 shows a portion 500 as an example of the island-like semiconductor layer A, and a portion 501 as an example of the island-like semiconductor layer B. That is to say, it is a mode that the island-like semiconductor layer B, which will finally become a channel area, a source area and a drain area of the transistor is included in the island-like semiconductor layer A.

Using the laser irradiator, which has the above-described first means to fourth means, the island-like semiconductor layer A is crystallized. At this time, using the fourth means, a part which is left as island-like semiconductor layer B on the substrate after patterning processing in the semiconductor film, which has been formed on the insulation surface, is comprehended in accordance with the data of the photomask configuration. And, the laser beam is irradiated selectively to the island-like semiconductor layer A to crystallize the area using the marker as the positional reference.

Next, the periphery portion of the island-like semiconductor layer A is subjected to a etching by means of photo lithography technique, and the island-like semiconductor layer B is subjected to a patterning processing. The island-like semiconductor layer B is used as the active layer of the transistor.

As described above, according to the invention, the laser beam is irradiated in such a manner that, not the entire semiconductor in the substrate surface is scanned by the laser beam, but at least the minimum indispensable portion thereof is crystallized. That is to say, by carrying out the patterning processing on the island-like semiconductor layer B after the semiconductor has been crystallized, it is possible to reduce the time necessary for irradiating the laser beam to the portion to be removed. Owing to this, it is possible to reduce the time necessary for laser crystallization and to increase the processing speed of the substrate.

It is necessary that, after forming the island-like semiconductor layer A, the laser beam irradiation is carried out; and after that, the island-like semiconductor layer B, which will become the active layer of the transistor, is formed, to ensure the positional control of the crystal grain in accordance with the layout of the TFT.

By applying the above-described constitution to the conventional SLS method, the problem in the conventional SLS method that substrate processing efficiency (throughput) is insufficient, is solved. Also, a means for ensuring the positional control of the crystal grain in accordance with the layout of the TFT is obtained.

Further, according to the invention, the time necessary for laser crystallization can be reduced. And further, a method that increases the processing speed of the substrate and a method that ensures the positional control of the crystal grain in accordance the layout of the TFT are obtained. Furthermore, unlike the conventional SLS method, the simple method that does not need to incorporate a mask for processing the configuration of laser beam power at the surface of the substrate into the optical system is obtained.

In order to obtain the super lateral growth, it is necessary to change the spatial energy distribution of the laser beam sharply in the direction of the lateral crystal growth (i.e., the direction in which the solid-liquid interface of the semiconductor film after laser irradiation). That is to say, it is necessary to eliminate the attenuation area width of optical power, which resides between the irradiation area and the non-irradiation area of the laser beam, as much as possible. The attenuation area width capable of obtaining satisfactory super lateral growth is defined as below; i.e., the attenuation area width from the peak position of the optical power to a point where the power decreases to 50% is 10 μm or less.

In the conventional SLS method, since an excimer laser is used, the density necessary for the super lateral growth cannot be obtained by the ordinary optical system only. Accordingly, it is understandable that a slit-like mask is necessary to be used to shield the laser beam partially.

The light source of the above-described laser beam is a system that irradiates the second harmonic (or, third harmonic or fourth harmonic) of the solid-state laser oscillator of pulse oscillation. Compared to the excimer laser, in the solid state laser, as the spreading angle of the output laser beam is small, owing to the laser constitution, with a cylindrical lens only that is used as ordinary optical system lens, it is possible to condense the beam into a spatial beam power profile of the laser beam that is the optimum for the super lateral growth.

In order to increase the substrate processing efficiency, it is desired to select a repeat frequency and a feed pitch that is the optimum for the SLS method. The conditions for that will be described below. The word "feed pitch" means shift distance of the substrate stage per pulse of the laser beam. In the SLS method, since the distance of the super lateral growth per shot is limited to a specific length, by enlarging the feed pitch only, the substrate processing efficiency cannot be increased. When the feed pitch is increased, it is necessary to increase also the repeat frequency of the laser beam accordingly. The XeCl excimer laser used in the conventional SLS method is maximum 300 Hz. On the other hand, the solid-state laser oscillator of pulse oscillation can increase the repeat frequency to the maximum several MHz. Accordingly, compared to the conventional SLS method, the processing capacity can be largely increased by driving the solid-state laser oscillator of pulse oscillation to irradiate at a repeat frequency. The upper limit of the repeat frequency can be determined within a range that ensures the energy density necessary for the super lateral growth at every shot of laser beam. The upper limit depends on the maximum output of the solid-state laser oscillator of pulse oscillation. (Since, if the other conditions are the same, when the frequency is increased, the energy density at every laser pulse is reduced.)

Further, in the solid-state laser oscillator, not the conventional flash lamp excitation but semiconductor laser excitation solid-state laser oscillator increases the stability of the laser beam energy largely. As a result, it is possible to form a semiconductor of which crystallinity fluctuation is smaller. Accordingly, it is possible to manufacture semiconductor device of which fluctuation in TFT characteristics is smaller.

Further, compared to the excimer laser irradiator, the solid-state laser oscillator is superior in maintainability.

Furthermore, compared to the excimer laser irradiator, the pulse width of the solid-state laser is longer. Since the time for melting and crystallizing becomes longer by adopting the longer pulse width, larger crystal grain can be formed.

Still further, by elongating the pulse width, it is possible to reduce the temperature difference between the semiconductor surface, where is to be irradiated by the laser, and the interface (for example, base film) between the semiconductor film and the film abutting to the bottom face thereof. As described above, by reducing the temperature difference, the core generating speed becomes slower.

FIG. 14 shows a result of simulation of the relationship between the pulse width and the base film temperature at crystallization. When the maximum reached temperature of the semiconductor surface is 1500 K, 2000 K and 2500 K respectively, the temperature of the base film tends to become higher as the pulse width is longer, and then, the level of the temperature becomes fixed. Also, when the pulse width is larger than 50 ns, and preferably, larger than 100 ns, it is possible to reduce the temperature difference between the base film temperature and the maximum reached temperature of the interface, it is possible to make the core generating speed more slowly.

The following table show a comparison between the XeCl gas laser irradiator and the Nd:YLF solid-state laser irradiator in the SLS method.

TABLE 1

| | XeCl excimer laser irradiator | Nd:YLF solid state laser |
|---|---|---|
| Laser medium | Gas (XeCl) | Solid state (Nd:YLF) |
| Excitation method | High voltage | DPSS (Diode excitation) |
| Maintenance | Necessary | Maintenance free |
| Pulse width | Approx. 25 nsec | 50-200 nsec |

TABLE 1-continued

|  | XeCl excimer laser irradiator | Nd:YLF solid state laser |
|---|---|---|
| Beam length | Less than 300 mm | 30-50 mm(Plural units available) |
| Machine price | 100 million or less | 18 million |
| Mask | Necessary | Mask-less |
| Optical system | Complicated (homogenizer, projection lens, etc) | Simple (convex and cylindrical lens) |

Owing to the constitution as described above, it is possible to provide a manufacturing method of semiconductor devices which is capable of forming large size crystal grains successively in a manner of super lateral growth under an artificial control, and capable of increasing the substrate processing efficiency in the laser crystallization process, as well as to provide a manufacturing method using a convenient laser irradiation method which does not need to incorporate a mask, which processes the configuration of the laser beam power into a slit-like shape on the substrate surface, into an optical system unlike the conventional SLS method.

The word "semiconductor device" in the invention includes every apparatus that is capable of functioning by using the semiconductor characteristics (for example, electronic device represented by liquid crystal display and electronic apparatus equipped with the electronic device as a part thereof).

BRIEF DESCRIPTION OF THE DRAWINGS

FIGS. 6A to 6D are illustrations showing a manufacturing method of an active matrix substrate;

FIGS. 7A to 7C are illustrations showing a manufacturing method of an active matrix substrate;

FIGS. 8A to 8C are illustrations showing a manufacturing method of an active matrix substrate;

FIG. 14 is a graph showing a simulation of a relationship between pulse width and base film temperature at crystallization.

DETAILED DESCRIPTION OF THE PREFERRED EMBODIMENT

Now, referring to the figures attached hereto, the mode for carrying out the invention will be described in detail.

Figure 1:
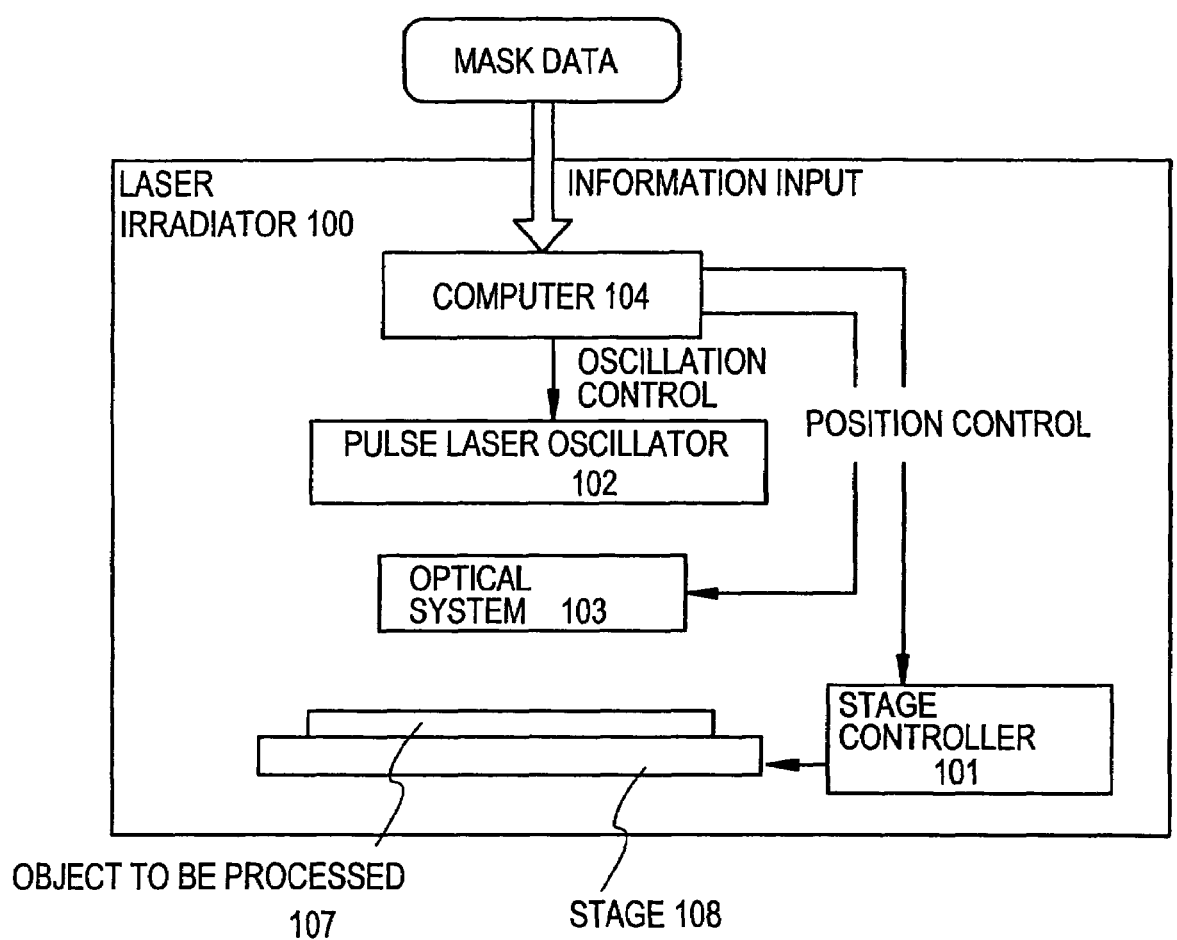
FIG. 1 is a diagram illustrating a configuration of a laser irradiator used in the invention.

FIG. 1 shows a block diagram illustrating a laser irradiation method according to the invention. In FIG. 1, two methods are shown as a first means, respectively, for controlling irradiation position of the pulse laser beam with respect to an object to be processed 107. One of the methods is such a method that the position of the object to be processed 107 (substrate), which is placed on a stage 108, is changed by driving the stage 108 by means of a stage controller 101. The other method is such a method that, in a state that the substrate position is fixed, the irradiation position of the laser beam spot is shifted using an optical system 103. In the invention, either one of methods may be adopted; or, a method, in which the above-mentioned two methods are combined with each other, may be adopted.

In the above-described two methods, both of them means the fact that relative position of the laser beam spot position with respect to the substrate is changed. Hereinafter, it will be referred to as "to scan (the laser beam spot)".

Also, a laser irradiator 100 has a pulse laser oscillator 102 which is a second means that oscillates the pulse laser beam. The pulse laser oscillator 102 can be appropriately replaced with another one in accordance with the processing object. Further, two pulse laser oscillators may be used being combined with each other. In the invention, a well-known laser may be used. As for the laser, a gas laser oscillator or a solid-state laser oscillator of pulse oscillation may be used. When a pulse oscillation gas laser is used, only a control by means of a photomask-like data pattern, which uses a computer 104 is applied thereto, and other constitution conforms to an ordinary SLS method. In the mode for carrying out the invention, a case, in which a solid-state laser oscillator of pulse oscillation is used, will be described.

As for the solid-state laser oscillator of pulse oscillation, as a light source, one or a plurality of kinds of lasers selected from YAG laser, YVO$_4$ laser, YLF laser, YAlO$_3$ laser, glass laser, ruby laser, alexandrite laser, Ti:sapphire laser, forsterite laser (Mg$_2$SiO$_4$) oscillator, which are doped with Cr$^{3+}$, Cr$^{4+}$, Nd$^{3+}$, Er$^{3+}$, Ce$^{3+}$, Co$^{2+}$, Ti$^{3+}$, Yb$^{3+}$, or V$^{3+}$ as a impurity, may be given.

As for the fundamental wave of the relevant laser, a laser beam having a fundamental wave of 1 μm or so is obtained, but it varies depending on the doping material. A second harmonic, a third harmonic, and a fourth harmonic with respect to the fundamental wave can be obtained by using a non-linear optical element.

Further, the laser irradiator 100 has an optical system 103 equivalent to the third means, which is capable of processing a beam spot of the laser beam oscillated by the pulse oscillator 102 in the object to be processed. The shape of the laser beam output from the pulse oscillator 102 is formed into a circular shape if the shape of the rod is circular; if the rod is slab-like shape, the shape thereof is formed into a rectangular shape. By further reforming the laser beam as described-above with the optical system, it is possible to form the beam spot of laser beam at the surface of the object to be processed 107. Further, depending on the purpose of the processing, a telescope, a homogenizer or the like may be incorporated into the optical system 103 to process the beam.

Furthermore, the laser irradiator 100 has a computer 104, which is equivalent to the fourth means. The computer 104 controls the oscillation of pulse oscillator 102, and controls stage controller 101, which is equivalent to first means, so that the beam spot of the laser beam covers a position specified by the data of a mask pattern.

In addition to the above described four means, this laser irradiation method may include a means for controlling the temperature of the object to be processed.

Figure 2:
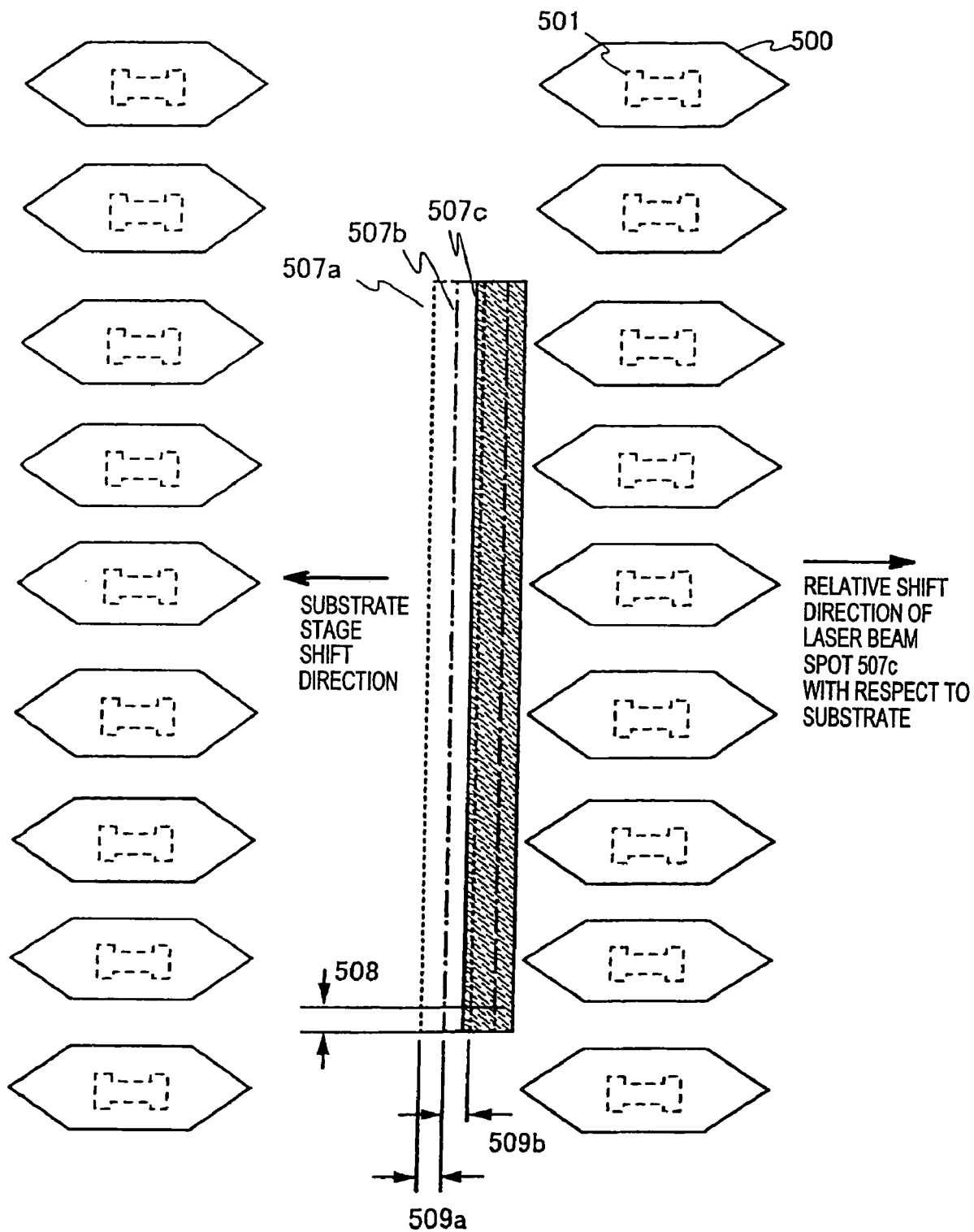
FIG. 2 is an illustration showing a laser beam spot, which shifts at every pulse with respect to an object to be processed.

FIG. 2 shows a state that the relative position between the substrate and the laser beam spot is displaced (to be scanned) at every laser beam pulse. Enlarged views of beam spots 507a, 507b and 507c are shown.

Reference symbol 507a in FIG. 2 denotes a laser beam spot position at a pulse irradiation; 507b denotes the laser beam spot position at the next pulse irradiation; and 507C denotes the laser beam spot position at the further next pulse irradiation. Reference symbols 509a and 509b denote substrate stage shift distance (feed pitch), respectively, at every one pulse of the laser beam. The feed pitch is required to be 0.3 µm or more and 5 µm or less, more preferably, to be 0.7 µm or more and 3 µm or less.

Further, as for the beam, the energy density at the edge portion of the laser beam is generally lower than the other portion, processing on the object to be processed may not be made evenly. Accordingly, it is preferred that the laser beam is irradiated so that the edge portion in the longitudinal direction of the beam spot 507a of the laser beam does not overlap with the potion 500 equivalent to an island-like semiconductor film A, which is obtained by patterning the semiconductor film after crystallization. For example, when scanning the beam spot of linear form, it is adapted so that the area, which is denoted by reference numeral 508 in FIG. 2, is not irradiated in the portion 500 equivalent to the above-described island-like semiconductor film A.

Figure 4A:
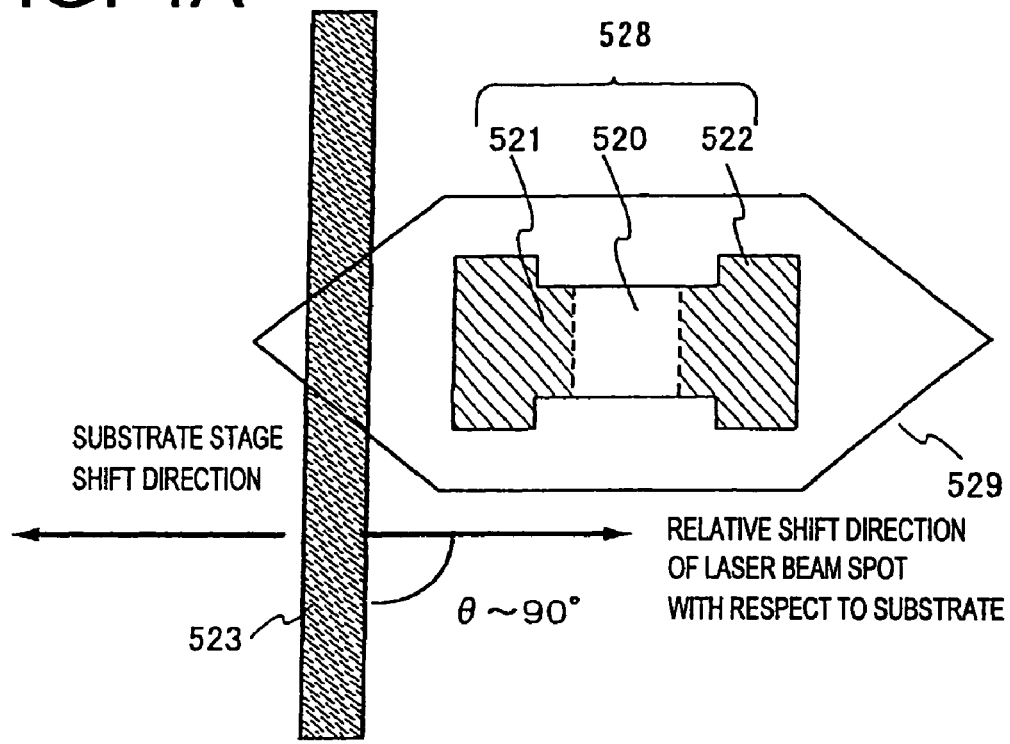
FIGS. 4A and 4B are illustrations showing a relationship between the channel length direction of a transistor and a laser beam spot in a relative movement.
Figure 4B:
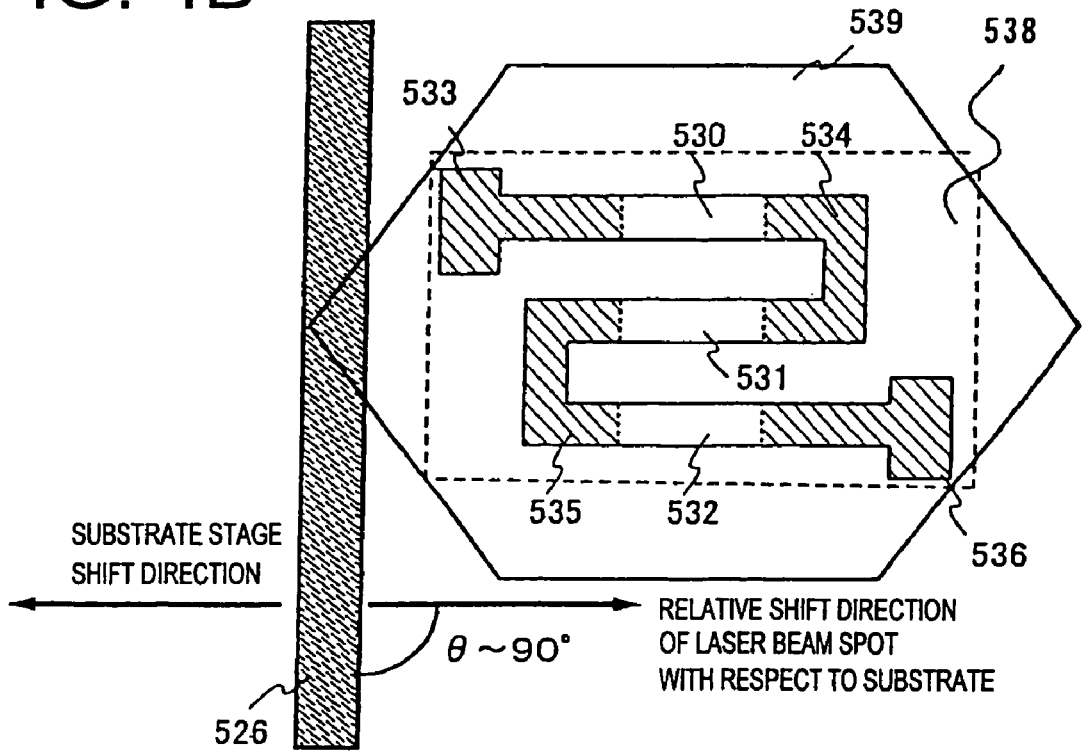

When the semiconductor after crystallization is used as the active layer of the TFT, it is preferred to fix the scan direction so as to be paralleled to the direction in which the carrier in the channel forming area moves. This is shown in FIG. 4A and FIG. 4B. Reference numerals 529 and 539 in FIG. 4 denote the island-like semiconductor layer A, respectively, which is formed before laser irradiation. Reference numerals 528 and 538 denote the area, respectively, which is formed as an island-like semiconductor layer B after laser irradiation.

FIG. 4A shows an example of an active layer of a single gate TFT which is provided with one channel forming area. A channel forming area 520, which comprises the island-like semiconductor layer B, and impurity areas 521 and 522, which will become a source area or a drain area, respectively, are provided. When crystallizing the semiconductor using the laser oscillator according to the invention, as shown with arrows, the scan direction of the laser beam is fixed so as to be paralleled to the direction in which the carrier in the channel forming area moves (channel length direction). Reference numeral 523 denotes the beam spot of the laser beam, which scans in the directions indicated with the arrows.

Also, in FIG. 4B, an example of an active layer of triple gate TFT to which three channel forming areas are provided is shown. Impurity are as 533 and 534 are provided so as to sandwich a channel forming area 530 therebetween; further, impurity areas 534 and 535 are provided so as to sandwich a channel forming area 531 therebetween; and furthermore, impurity areas 535 and 536 are provided so as to sandwich a channel forming area 532 therebetween. When the semiconductor is crystallized using the laser oscillator according to the invention, the laser beam scans in the direction of the arrows.

However, as a matter of convenience of circuit layout, as for the TFT used in active matrix display, the direction of carriers, moving into the respective active layer channel forming areas, may sometimes be different from each other, in the pixel section, the signal line drive circuit section, and the scan line drive circuit section. In such a case also, the invention is effective, and that will be described referring to FIG. 3.

Figure 3A:
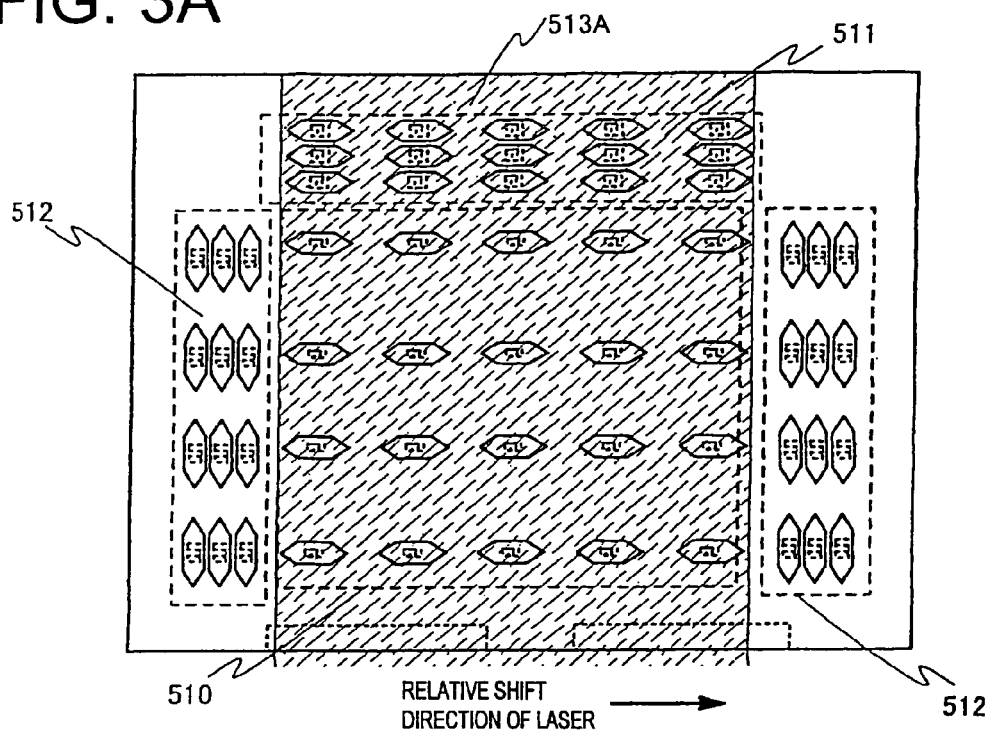
FIGS. 3A and 3B are illustrations showing a laser beam irradiation spot of which relative movement direction within a substrate is changed by means of rotation of the substrate.

FIG. 3 shows a case that the scan directions of the laser beam in the scan line drive circuit area 512 is different from those in the other areas. First of all, using the markers formed on the substrate as the positional references, as shown in FIG. 3A, area 511, which will become a signal line drive circuit, and area 510, which will become a pixel section, are subjected to the laser irradiation.

Figure 3B:
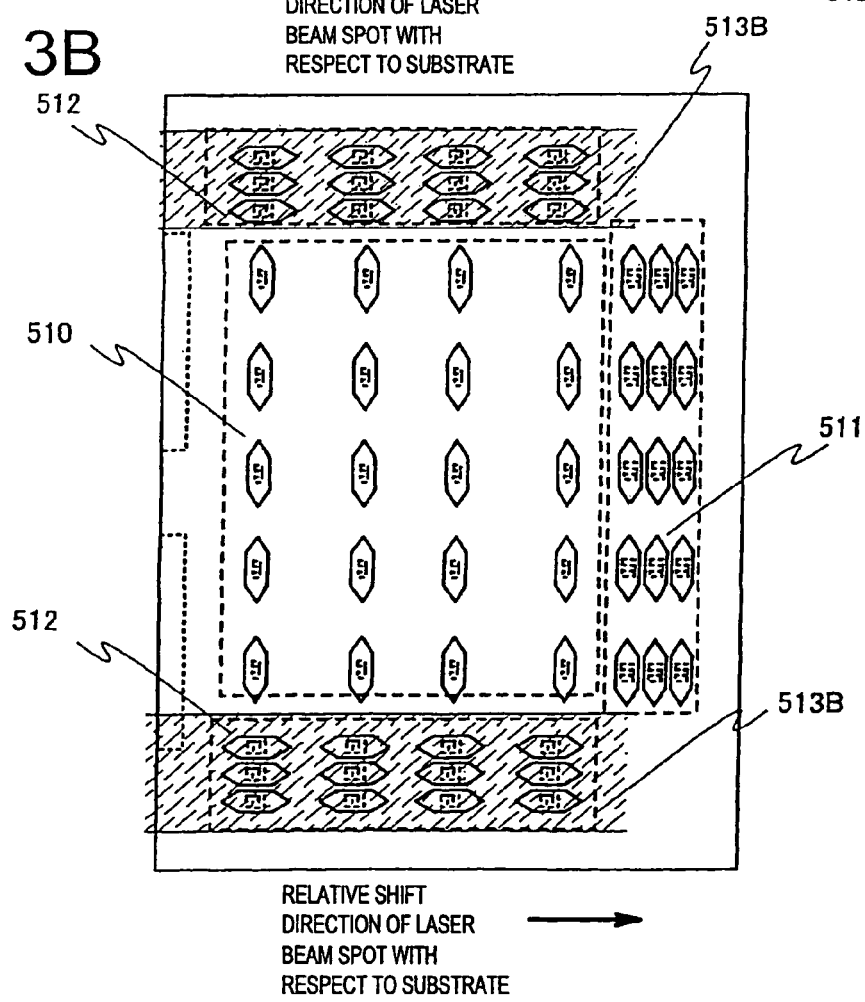

Next, as shown in FIG. 3B, the substrate stage is turned by 90° and the markers formed on the substrate are read again. Based on the positional information, the area 512, which will become a scan line drive circuit is subjected to the laser irradiation. Thus, it is possible to change the relative shift direction of the laser beam spot within the substrate and to irradiate the same.

Further, there may be a case that, even when the laser irradiation is being carried out, the laser beam should not be irradiated temporarily to the surface of the substrate. In this case, an AO (acoustooptics) light modulation device, which is capable of temporarily and completely shielding the laser beam, may be provided in an optical system between the substrate, which is the object to be processed and the laser oscillator.

Figure 5A:
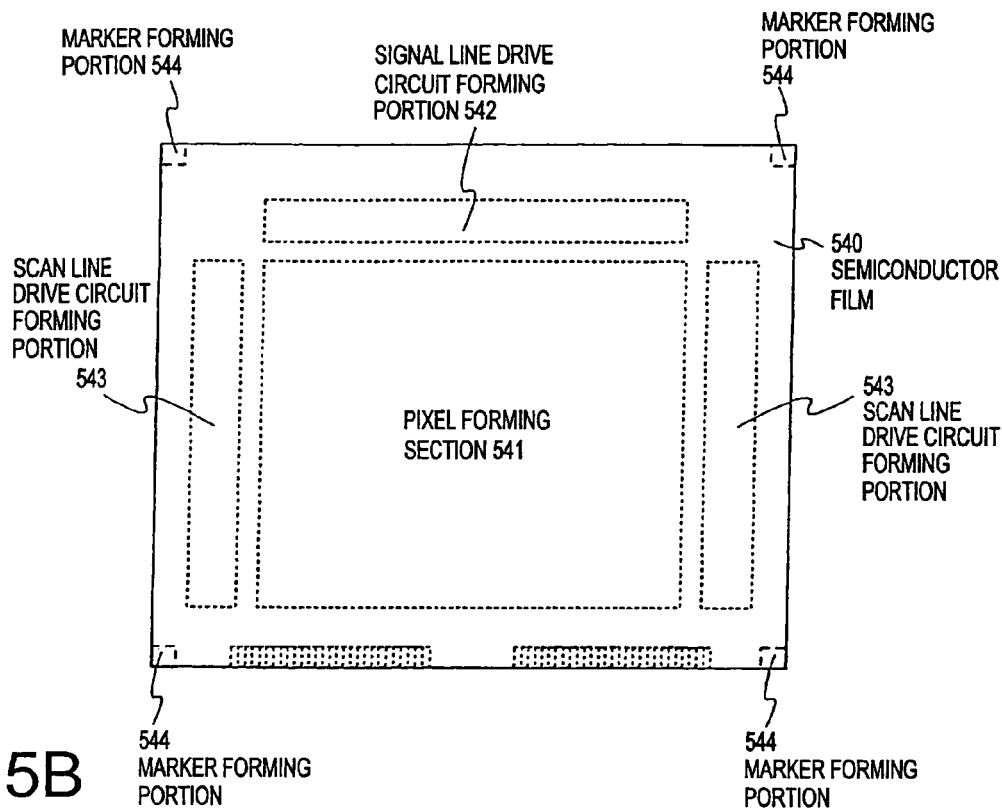
FIGS. 5A and 5B are illustrations showing marker-forming portions.
Figure 5B:
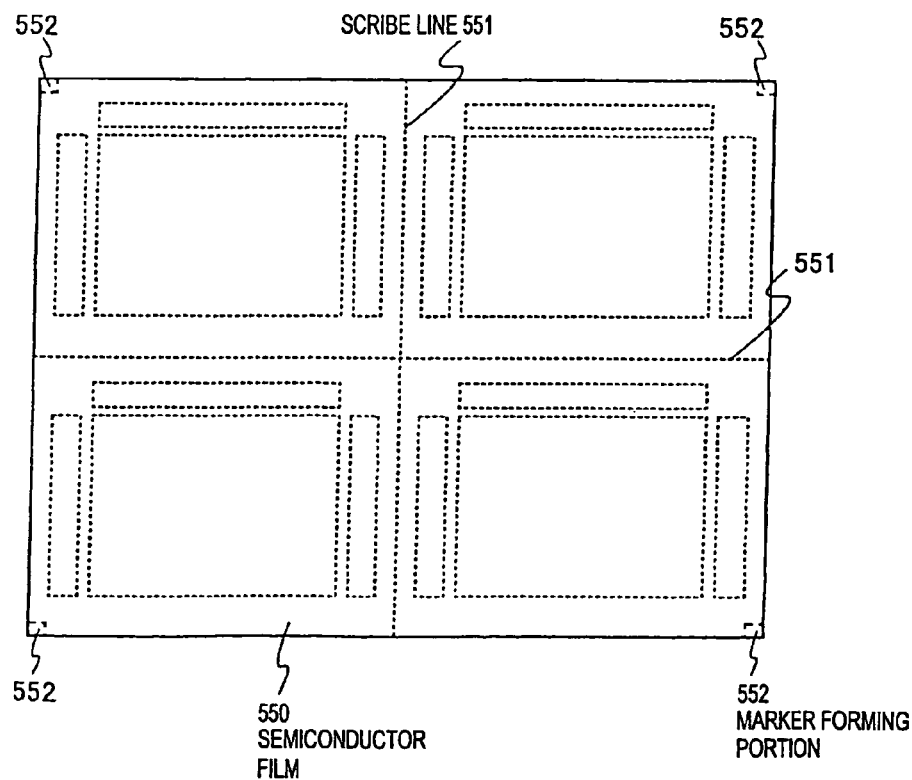

In order to determine the irradiation position of the laser beam, it is necessary to form the markers for positioning with respect to the semiconductor film thereon. FIG. 5 shows the positions where markers are formed in a semiconductor film, which is formed to prepare an active matrix type semiconductor device. FIG. 5A shows an example of the case that one semiconductor device is prepared from one substrate; FIG. 5B shows the case that four semiconductor devices are prepared from one substrate.

In FIG. 5A, reference numeral 540 denotes an area where a semiconductor film is formed on the substrate; dotted line 541 denotes an area where a pixel section is formed; dotted line 542 denotes an area where a signal line drive circuit is formed; dotted line 543 denotes an area where a scan line drive circuit is formed. Reference numeral 544 denotes areas where a marker is formed (marker forming portion), and are provided to be positioned at four corners of the semiconductor.

In FIG. 5A, although the marker forming portion 544 is provided at four corners respectively, the invention is not limited thereto. Assuming that the positioning of the scan area of the laser beam in the semiconductor and the patterning mask of the semiconductor is obtained, the position and number of the marker forming portions are not limited to the mode described-above.

In FIG. 5B, reference numeral 550 denotes a semiconductor formed on the substrate; dotted line 551 denotes a scribe line, which is used to cut off the substrates in the later process. In FIG. 5B, by cutting off the substrates along the scribe line 551, four semiconductor devices can be manufactured. The number of the semiconductor devices, which are obtained by cutting off, is not particularly limited to this.

Reference numeral 552 denotes a portion a marker is formed (marker forming portion), and is provided at four corners of the semiconductor. In FIG. 5B, although the marker forming portion 552 is provided at four corners respectively, the invention is not limited thereto. Assuming that the positioning of the scan area of the laser beam in the semiconductor and the patterning mask of the semiconductor film is obtained, the position and number of the marker forming portions are not limited to the mode described-above.

The markers are formed simultaneously in the conventional photo lithography process in which the island-like semiconductor film A is formed in a manner of patterning.

Owing to the constitution as described above, after crystallizing the semiconductor, it is possible to reduce the time necessary for the laser beam irradiation and the processing speed of the substrate can be improved, because it can omit the time necessary for irradiating the laser beam to the semiconductor area, which is removed due to the forming of island-like semiconductor film B.

EXAMPLES

Example 1

Referring to FIG. 6 to 9, in the Example 1, a manufacturing method of active matrix substrate will be described. Herein, as a matter of convenience, a substrate, which is formed with a CMOS circuit, a drive circuit, and a pixel section having a pixel TFT and a holding capacity on the same substrate, will be called as active matrix substrate.

First of all, in the Example 1, a substrate 600 comprised of a barium borosilicate glass or an aluminum borosilicate glass or the like is used. As for the substrate 600, a substrate formed with an insulating film on the surface of a quarts substrate, a silicon substrate, a metal substrate or a stainless substrate may be used. Also, a plastic substrate having heat resistance against the processing temperature of the Example 1 may be used.

Then, on the substrate 600, a base film 601 comprised of an insulating film of a silicon dioxide film, a silicon nitride film, or a silicon oxide nitride film or the like is formed in a manner of well-known means (sputtering, LPCVD, plasma CVD or the like). According to the Example 1, as a base film 601, a double-layered base film comprised of base films 601a and 601b is used. However, a structure of a single-layered or double-layered film of the above-described insulating film may be used (FIG. 6A).

Next, on the base film 601, an amorphous semiconductor film 692 is formed at a thickness of 25-150 nm (preferably, 30-120 nm) in a manner of a well-known means (sputtering, LPCVD, plasma CVD or the like) (FIG. 6A). According to the Example 1, although an amorphous semiconductor film is formed, a micro crystal semiconductor film or a crystal semiconductor film is also applicable. Further, a chemical compound semiconductor having an amorphous structure of an amorphous silicon germanium film or the like may be used.

Next, the amorphous semiconductor film 692 is subjected to a patterning, and by carrying out an etching in a manner of anisotropic dry etching in an atmosphere containing a halogen fluoride, for example, ClF, ClF$_3$, BrF, BrF$_3$, IF, IF$_3$ or the like, portions 693a, 693b and 693c, which will become an island-like semiconductor film A respectively, are formed (FIG. 6B).

Next, the portions 693a, 693b and 693c on the island-like semiconductor film A are crystallized in a manner of laser crystallization. The laser crystallization is carried out using the laser irradiation method according to the invention. Particularly, in accordance with mask information input in the computer of the laser irradiator, a laser beam is irradiated selectively to the portions 693a, 693b and 693c on the island-like semiconductor film A. Needless to say, not only the laser crystallization, but also, the crystallization may be carried out in a combination with another well-known crystallization method (RTA, heat crystallization using furnace annealing, heat crystallization using a metal element, which accelerate the crystallization, or the like).

In the laser irradiation method according to the invention, a gas laser oscillator or a solid-state laser oscillator of pulse oscillation in well-known laser sources is usable. When a gas laser of pulse oscillation is used, only a control by means of laser oscillator data pattern of photomask configuration using a computer 104 is applied thereto, and the other constitution conforms to ordinary SLS method. In Example 1, the case, in which an Nd:YLF laser of pulse oscillation is used, will be described.

Figure 10A:
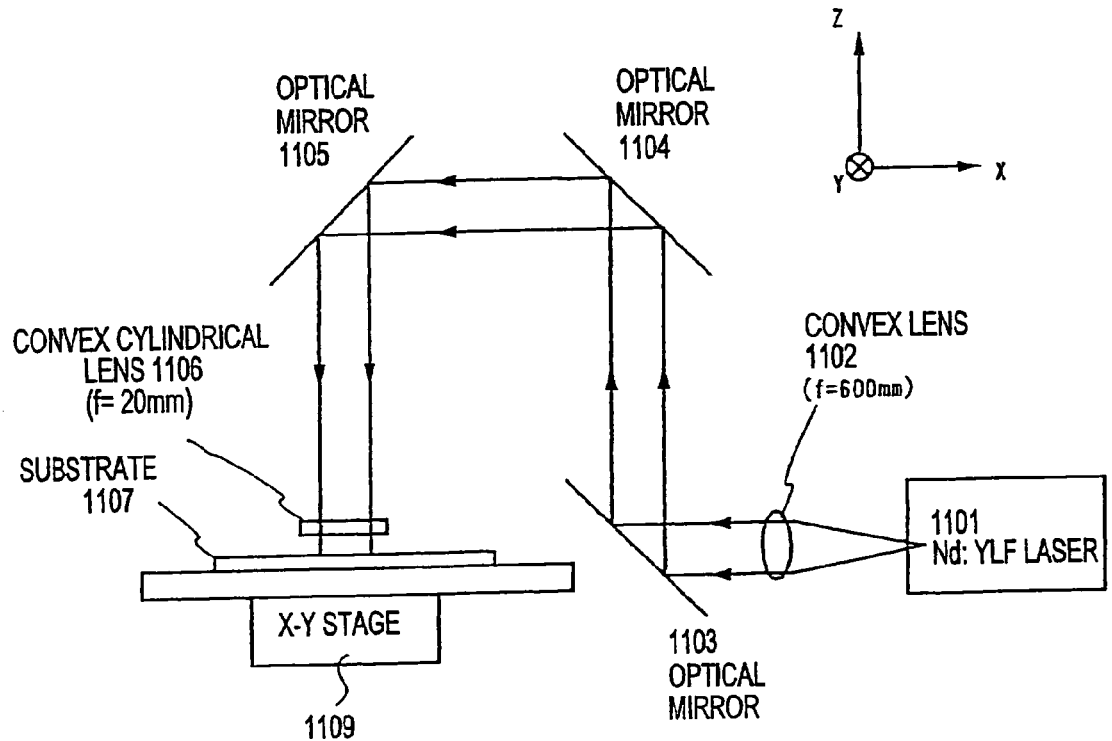
FIGS. 10A and 10B are illustrations of an optical system of the laser irradiator, which will be described in Embodiment 1.
Figure 10B:
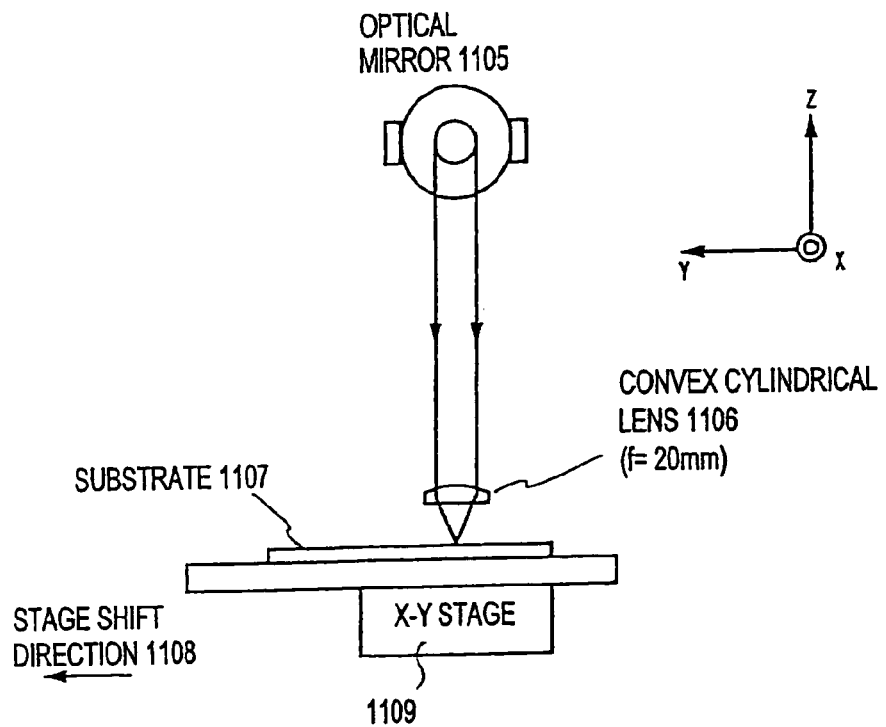

FIGS. 10A and 10B show a laser crystallization processing apparatus. FIGS. 10A and 10B show a case, in which an Nd:YLF laser oscillator laser source 1101 is used under the conditions of 1.5 W output and 1 kHz repeat frequency. The laser source 1101 is a method, in which an YLF crystal and a non-linear optical element is placed in a resonator, and a second harmonic of 527 nm wavelength is output. Needless to say, the non-linear optical element may be placed outside the resonator. Further, as for the laser oscillator 1101, the rod is cylindrical in configuration, and the configuration of the beam spot immediately after output from the laser oscillator 1101 is circular. Even when the configuration of the rod is slab-like shape and the configuration of the beam spot immediately after output is rectangular shape, as described below, the beam spot can be reformed into a desired configuration by means of optical system.

As for the Nd:YLF laser, the spreading angle of the beam is 3 mm radian; although the beam size is approximately 2 mm in diameter at the outlet port, it expands to approximately 1 cm in diameter at a position 20 cm away from the outlet port. When a convex lens 1102 of focal length f=600 mm is placed at this position, the beam is reformed into a parallel beam of 10 mm in diameter. The laser beam, which is reflected by the optical mirrors 1103-1105 shown in FIG. 10A, is condensed by a convex cylindrical lens 1106 having the curvature in the direction of Y in FIG. 10A. Herein, the Y-direction is the shift direction of the beam spot of the laser beam on the semiconductor surface, and is the shorter direction of the beam spot. Also, the X-direction in FIG. 10A is the longitudinal direction of the beam spot of the laser beam on the semiconductor surface, and crosses at right angles with the shift direction of the beam spot of the laser beam on the semiconductor surface (optical mirrors 1103-1105 are placed on the ground of the layout of the apparatus, but it is not always indispensable). Owing to the constitution as described above, the beam spot on the semiconductor surface, which is the irradiation surface, is reformed into a linear shaped beam of 10 mm×10 μm.

However, the method of reforming the laser beam of rectangular, elliptical or linear shape at the irradiation surface is not limited to the above. Although not shown in the figures, it is possible to elongate the beam spot in longitudinal direction by placing a concave cylindrical lens between the optical mirror 1103 and the convex cylindrical lens 1106. Also it is possible to place a beam collimator for reforming the laser beam into a parallel beam or a beam expander for expanding the laser beam between the concave cylindrical lens and the laser oscillator 1101. A method of reforming a beam into a linear shaped beam using a laser source of 1.5 W output with a beam spot of 10 mm×10 μm has been described here. However, in the case of a larger output laser source, it is preferred that the beam spot size in the longitudinal direction only is enlarged without changing the beam spot size in the shorter direction (currently, an oscillator of LD excitation Nd:YLF laser, which is operable at 20V output, is commercially available).

In order to shift the relative position of the beam spot of the laser beam on the semiconductor surface, a substrate stage 1109 is made to sweep in the Y-direction (shorter direction of the beam spot). When the sweep speed of the substrate stage is 3.0 mm/sec. at 1 kHz laser pulse repeat frequency, at every irradiation of the laser pulse, the relative position between the substrate and the beam spot displaces by 3 μm in the Y-direction (feed pitch is 3 μm).

Figure 11A:
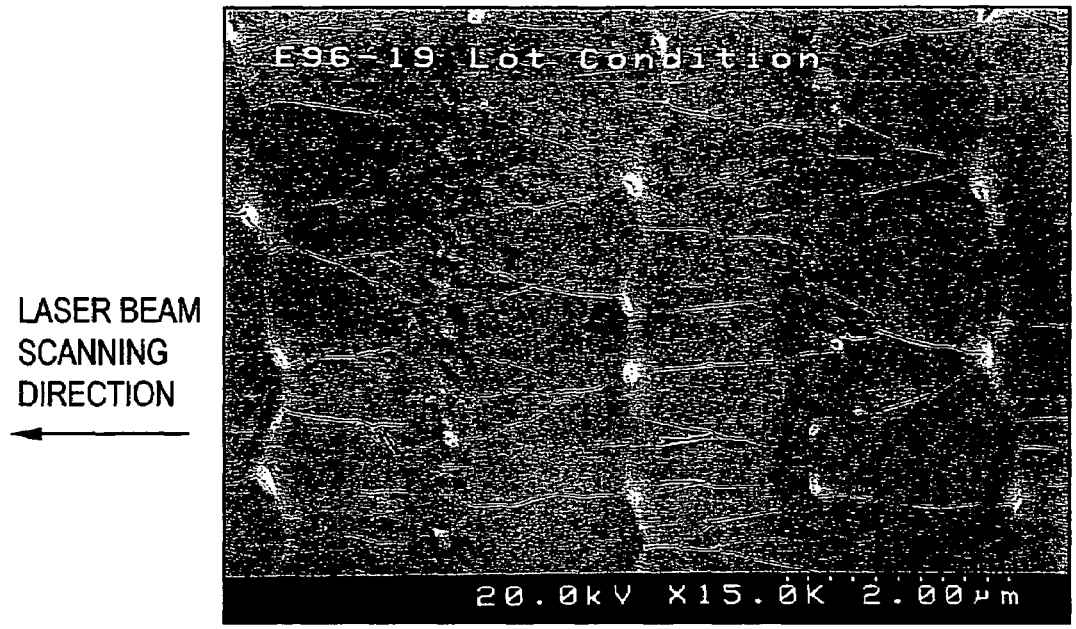
FIG. 11A is a picture showing a surface SEM image after laser crystallization.
Figure 11B:
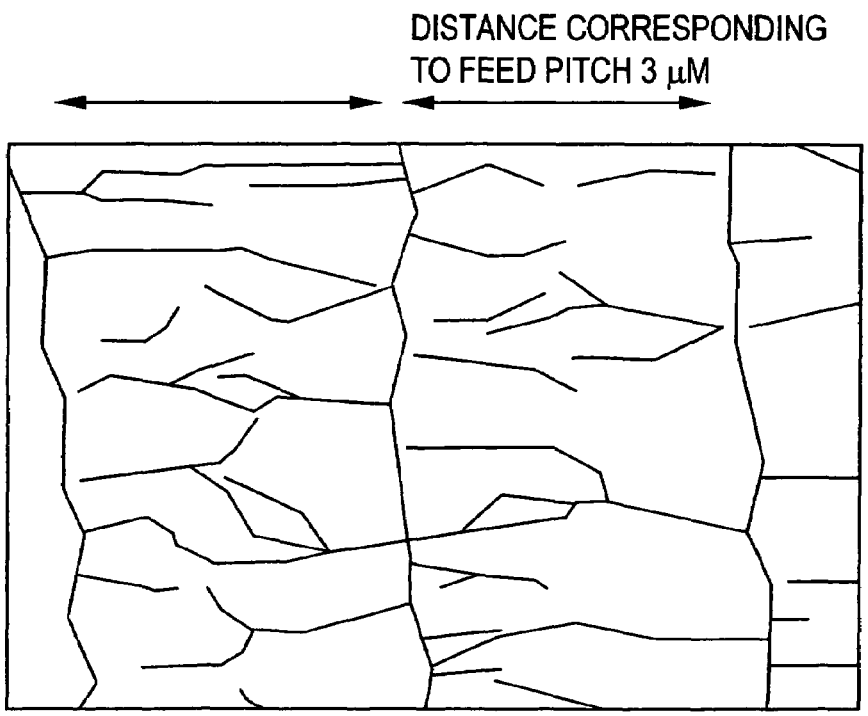
FIG. 11B is an illustration showing a status of crystal grain boundary.

FIG. 11A is a SEM observation of a silicon film, which has been crystallized by means of the laser irradiation method according to the Example 1, in which crystal grain boundary is visualized in a manner of Secco Etching. FIG. 11B and FIG. 11A show the crystal grain boundary and the size thereof so as to be understood easily. Referring to this, it is understood that crystals, which have been subjected to the super lateral growth in the Y-direction of the scanned beam spot of the laser beam, are formed continuously. The grain boundaries reside periodically in the scan direction and the vertical direction of the laser beam spot. It is understood that the period correspond to 3 μm, which is the feed pitch of the laser pulse at every irradiation.

Owing to the above described laser crystallization, portions 694a, 694b and 694c of island-like semiconductor film A, of which crystallinity has been increased (FIG. 6C).

Next, by patterning the portions 694a, 694b and 694c of the island-like semiconductor film A into a desired configuration respectively, portions 602-606 of an island-like semiconductor film B are formed (FIG. 6D).

After forming the portions 602-606 of the island-like semiconductor film B, in order to control the threshold of the TFT, minute amount of impurity element (Boron or phosphorous) may be doped. The impurity doping for controlling the threshold may be carried out before the laser crystallization, or after forming a gate insulating film.

Next, a gate insulating film 607 that covers island-like semiconductor films 602-606 is formed. The gate insulating film 607 is formed with an insulating film, which contains silicon, of 40-150 nm in thickness in a manner of plasma CVD or sputtering. According to the Example 1, the gate insulating film 607 is formed with a silicon nitride oxide film (constitution ratio: Si=32%, O=59%, N=7% and H=2%) at 110 nm in thickness in the manner of plasma CVD. Needless to say, the gate insulating film is not limited to the silicon nitride oxide film, but another insulating film, which contains silicon, may be formed into a single-layered or laminated structure.

Further, when a silicon dioxide film is used, the gate insulating film can be formed in a manner of the plasma CVD, by mixing TEOS (Tetraethyl Ortho Silicate) and $O_2$: at 40 Pa reaction pressure and 300-400° C. substrate temperature, and by discharging high frequency (13.56 MHz) at 0.5-0.8 W/cm$^2$ of electric power density. The silicon dioxide film prepared in the above-described manner is subjected to a heat anneal at 400-500° C., thereby excellent characteristics as the gate insulating film are obtained.

Next, formed on the gate insulating film 607 is a first conductive film 608 of 20-100 nm in film thickness and a second conductive film 609 of 100-400 nm in film thickness. According to the Example 1, the first conductive film 608 comprised of a TaN film of 30 nm in film thickness and the second conductive film 609 comprised of a W film of 370 nm in film thickness are built-up to form a laminated layer. The TaN film is formed in a manner of sputtering using a target of Ta, and sputtering in an atmosphere containing Nitrogen. Also, the W film is formed in a manner of sputtering using a target of W. Other than the above, the above-described film may be formed in a manner of thermal CVD using Tungsten hexafluoride (WF$_6$). In any case, to use the film as the gate electrode, it is necessary to lower the resistance, and as for the resistance of the W film, it is desired to be less than 20 μΩcm. As for the W film, although it is possible to lower the resistance by forming larger crystal grains, in the case that a large amount of impurity element such as oxygen or the like is contained in the W film, the crystallization is inhibited resulting in a larger resistance. Therefore, according to the Example 1, by carrying out the sputtering using a high purity W (purity level: 99.9999%) as a target, and furthermore, while paying a great attention not to allow any impurity to come in from the atmosphere during the film forming, the W film is formed achieving a resistance of 9-20 μΩcm.

According to the Example 1, the first conductive film 608 is formed with TaN and the second conductive film 609 is formed with W. However, the above is not limited thereto. In any case, the film may be formed with an element selected from Ta, W, Ti, Mo, Al, Cu, Cr and Nd; or, the film may be formed with an alloy material containing the above element as the main component, or a compound material. Also, a semiconductor represented by a polycrystalline silicon film doped with impurity element like phosphorous, or AgPdCu alloy may be used. Further, a combination of a first conductive film formed with a Tantalum (Ta) film and the second conductive film formed with a W film; a combination of a first conductive film formed with a Titanium nitride (TiN) film and the second conductive film formed with a W film; a combination of a first conductive film formed with Tantalum nitride (TaN) and the second conductive film formed with a W film; a combination of a first conductive film formed with Tantalum nitride (TaN) and the second conductive film formed with an Al film; or a combination of a first conductive film formed with Tantalum nitride (TaN) and the second conductive film formed with an Cu film may be used.

Further, not limited to the double-layered structure, but, for example, a triple-layered structure, which is built-up with a Tungsten film, an alloy film of aluminum and silicon (Al—Si) film and a Titanium nitride film in order may be used. Furthermore, when a triple-layered structure is adopted, a nitride Tungsten may be used in place of Tungsten; an alloy film (Al—Ti) of aluminum and Titanium in place of the alloy (Al—Si) film of aluminum silicon may be adopted; and a Titanium film may be used in place of the Titanium nitride film.

It is important to collect the optimum etching method and type of the etchant depending on the material of the conductive film.

Next, using a photo lithography, masks 610-615 comprised of a resist are formed, and are subjected to a first etching processing to form electrodes and wirings. The first etching processing is carried out under the first and the second etching condition S (FIG. 7B). According to the Example 1, as for the first etching conditions, ICP (Inductively Coupled Plasma) etching is adopted; as for etching gases, CF$_4$, Cl$_2$ and O$_2$ are used, and the gas flow rate is 25:25:10 (sccm) respectively. Under a pressure of 1 Pa, an RF (13.56 MHz) electric power of 500 W is applied to coil type electrode to generate plasma, and the etching is carried out. To the substrate side (object stage) also, an RF (13.56 MHz) electric power of 150 W is supplied to impress a substantially negative self-bias voltage thereto. Under the first etching conditions, the W-film is subjected to the etching to form the edge of the first electrical conducting layer into a tapered configuration.

After that, without removing the masks 610-615 comprised of a resist, the etching condition is changed to second etching conditions. As for the etching gases, CF$_4$ and Cl$_2$ are used, and the gas flow rate is 30:30 (sccm) respectively. Under a pressure of 1 Pa, an RF (13.56 MHz) electric power of 500 W is supplied to the coil type electrode to generate plasma, and the etching is carried out approximately for 30 seconds. To the substrate side (object stage) also, an RF (13.56 MHz) electric power of 20 W is supplied to impress a substantially negative self-bias voltage thereto. Under the second etching conditions, in which $CF_4$ and $Cl_2$ are mixed, both of the W film and the TaN film are etched to the same level. To carry out the etching without remaining any residue on the gate insulating film, it is preferred to increase the etching time by approximately 10-20%.

In the above-described first etching processing, By adapting appropriately the configuration of the mask comprised of a resist, the edge of the first electrical conducting layer and the second electrical conducting layer are formed into a tapered configuration, owing to the bias voltage, which is applied to the substrate side. The angle of the tapered portion is 15-45° Owing to the first etching processing, the electrical conducting layers 617-622 (first electrical conducting layers 617a-622a and second electrical conducting layers 617b-622b) of a first configuration, which are comprised of the first electrical conducting layer and the second electrical conducting layer, are formed. Reference numeral 616 denotes a gate insulating film, and the areas thereof, which are not covered by the electrical conducting layers 617-622 of the first configuration are formed into thin areas which has been etched approximately 20-50 nm.

Next, without removing the mask comprised of a resist, a second etching processing is carried out (FIG. 7C). In this case, as for the etching gases, $CF_4$, $Cl_2$ and $O_2$ are used, and the W-film is selectively etched. And then, by means of the second etching processing, second electrical conducting layers 628b-633b are formed. On the other hand, the first electrical conducting layers 617a-622a are little etched, and electrical conducting layers 628-633 of a second configuration are formed.

Then, without removing the mask comprised of a resist, a first doping treatment is carried out, an impurity element that imparts the N-type to the island-like semiconductors at a low density. The doping treatment may be carried out in a manner of ion doping or ion implantation. As for the conditions for the ion doping, dose amount is $1\times10^{13}$-$5\times10^4$ atoms/cm$^2$; and the acceleration voltage is 40-80 keV. According to the Example 1, the dose amount is $11.5\times10^{13}$ atoms/cm$^2$; and the acceleration voltage is 60 keV.

As an impurity element imparting the N-type, although an element included in the 15-family, typically, phosphorous (P) or Arsenic (As) is used, phosphorous (P) is used in the Example 1. In this case, electrical conducting layers 628-633 serve as the masks against the impurity element imparting the N-type, impurity areas 623-627 are formed in a manner of self-aligning. To the impurity areas 623-627, the impurity element imparting the N-type within the density range of $1\times10^{18}$-$1\times10^{20}$ atoms/cm$^3$ is added.

After removing the masks comprised of a resist, new masks 634a-634c comprised of a resist are formed, and are subjected to a second doping treatment at an acceleration voltage higher than that of the first doping treatment. As for the conditions for the ion doping, dose amount is $1\times10^{13}$-$1\times10^{15}$ atoms/cm$^2$; acceleration voltage is 60-120 keV. As for the doping treatment, the second electrical conducting layers 628b, 630b and 632b are used as masks against the impurity element, and the doping is carried out so that the impurity element is added to the island-like semiconductors below the tapered portion of the first electrical conducting layer. Then, the acceleration voltage is reduced lower than that of the second doping treatment, and a third doping treatment is carried out to obtain a state shown in FIG. 8A. As for the conditions for the ion doping, dose amount is $1\times10^{15}$-$1\times10^{17}$ atoms/cm$^2$; and the acceleration voltage is 50-100 keV. Owing to the second doping treatment and the third doping treatment, to the low density areas 636, 642 and 648 which overlap with the first electrical conducting layer, an impurity element imparting the N-type is added within the density range of $1\times10^{18}$-$5\times10^{19}$ atoms/cm$^3$; and to high density impurity areas 635, 641, 644 and 647, an impurity element imparting the N-type is added within the density range of $1\times10^{19}$-$5\times10^{21}$ atoms/cm$^3$.

Of course, as for the second doping treatment and the third doping treatment, by adapting an appropriate acceleration voltage, it is possible to form the low-density impurity area and the high-density impurity area, respectively, by one doping treatment.

Next, after removing the resist masks, new resist masks 650a-650c are formed, and are subjected to a fourth doping treatment. Owing to the fourth doping treatment, to the island-like semiconductors, which become the active layers of a P-channel type TFT, impurity areas 653, 654, 659 and 660, added with an impurity element imparting a conductive type opposite to the above-described conductive type, are formed. Using the second electrical conducting layers 628b-632b as the masks against the impurity element, an impurity element imparting P-type is added to form impurity areas in a manner of self-aligning. According to the Example 1, the impurity areas 653, 654, 659 and 660 are formed by means of ion doping using diborane ($B_2H_6$) (FIG. 8B). When the fourth doping treatment is carried out, the island-like semiconductors for forming N-channel type TFT are covered with the masks 650a-650c comprised of a resist. Owing to the first to third doping treatment, to the impurity areas 653, 659 and 660, phosphorous is added at a density different from each other, respectively. By carrying out doping treatment so that, in any area of the above, the density of the impurity element imparting P-type is $1\times10^{19}$-$5\times10^{21}$ atoms/cm$^3$, since the impurity areas function as the source area and the drain area of the p-channel type TFT, no problem occurs.

By carrying out steps up to the step described above, impurity area is formed in the respective island-like semiconductors. Then, an activation processing is carried out. As for the activation processing, well-known laser activation, thermal activation or RTA activation is applicable thereto. Further, the laser activation-processing step may be done, after the first interlayer insulating film has been formed.

Then, the mask 650a-650c comprised of a resist is removed, and a first interlayer insulating film 661 is formed. As for the first interlayer insulating film 661, using the method of plasma CVD or sputtering, the insulating film, which contains silicon, is formed in thickness of 100-200 nm. According to the Example 1, a silicon nitride-oxide film of 150 nm in film thickness is formed by means of plasma CVD. Of course, the first interlayer insulating film 661 is not limited to the silicon nitride-oxide film. Another single or laminated layered insulating film, which contains silicon, may be used.

Then, by carrying out heat processing (heat treatment for 1-12 hours at 300-550° C.), the film is hydrogenated. This process is for terminating the dangling bond of the island-like semiconductor by means of hydrogen, which is contained in the first interlayer insulating film 661. Irrespective of first interlayer insulating film, the island-like semiconductor can be hydrogenated. As for another means for the hydrogenation, the film may be subjected to plasma hydrogenation (hydrogen excited by plasma is used), or to a heat treatment for 1-12 hours at 300-650° C. in an atmosphere containing 3-100% of hydrogen.

Next, formed on the first interlayer insulating film 661 is a second interlayer insulating film 662 comprised of an inorganic insulation film material or an organic insulation material. According to the Example 1, an acrylic resin film of 1.6 μm in film thickness is formed using a material of 10-1000 cp, preferably, 40-200 cp in viscosity, which forms unevenness on the surface.

According to Example 1, in order to prevent specular reflexion, unevenness is formed on the surface of the pixel electrode by forming second interlayer insulating film, which is formed with unevenness on the surface thereof. Further, in order to obtain light scattering by giving unevenness to the pixel electrode, a convex portion may be formed in the area below the pixel electrode. In that case, since the convex portion can be formed using the same photomask as that for forming the TFT, the convex portion can be formed without increasing the number of steps. The convex portion may be formed appropriately on the substrate in a pixel section area other than the wiring and TFT portions. Thus, unevenness is formed on the surface of the pixel electrode along the unevenness formed on the surface of the insulating film, which covers the convex.

Further, a film of which surface is planarized may be used as the second interlayer insulating film 662. In that case, it is preferred that, after the pixel electrode is formed, a process such as well-known sandblasting, etching or the like is added to make the surface thereof uneven to prevent specular reflexion, and thereby reflected light is scattered, resulting in a increased white level.

Next, after forming the second interlayer insulating film 662, a third interlayer insulating film 672 is formed so as to come in contact with the second interlayer insulating film 662.

Figure 9:
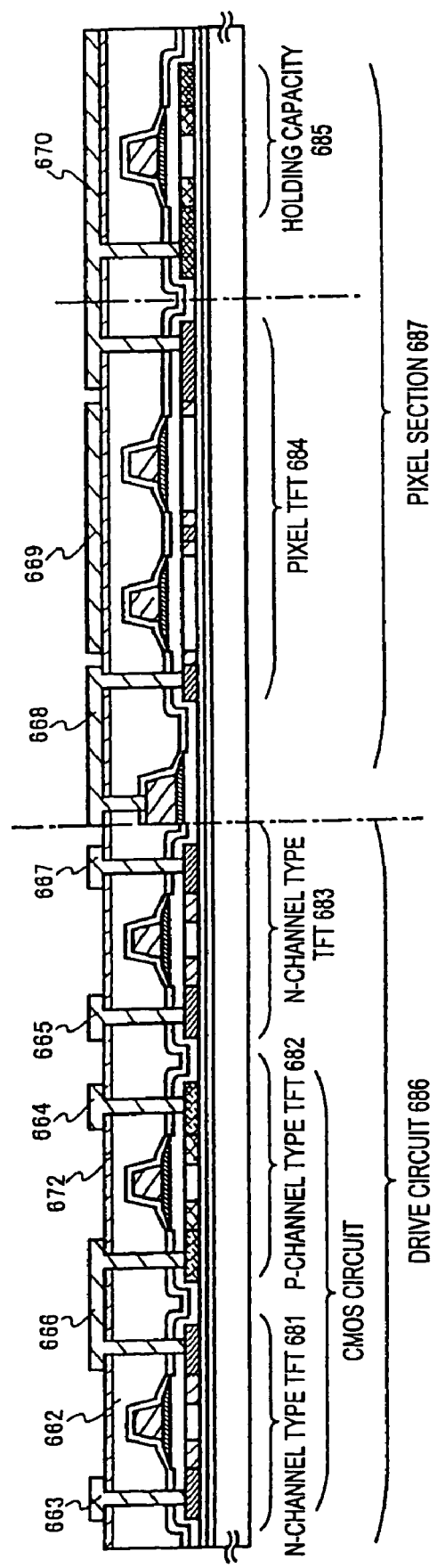
FIG. 9 is an illustration showing a manufacturing method of an active matrix substrate.

Then, in a drive circuit 686, wirings 663-667 that connect the respective impurity areas with each other electrically, are formed. These wirings are formed by means of patterning a laminated film comprised of a Ti film of 50 nm in film thickness and an alloy film (alloy film of Al and Ti) of 500 nm in film thickness. Of course, not limited to the double-layered structure, a single-layered structure or a triple-layered structure may be adopted. Also, the material for the wirings is not limited to Al and Ti. For example, the wirings may be formed by patterning a laminated film, in which Al or Cu is formed on a TaN film, and further thereon, a Ti film is formed (FIG. 9).

Further, in a pixel section 687, a pixel electrode 670, a gate wiring 669 and a connecting electrode 668 are formed. Owing to the connecting electrode 668, the source wiring (lamination of 633a and 633b) is formed with an electrical connection with the pixel TFT. Also, the gate wiring 669 is formed with an electrical connection with the gate electrode of the pixel TFT. Further, the pixel electrode 670 is formed with an electrical connection with a drain area 658 of the pixel TFT; and furthermore, formed with an electrical connection with the island-like semiconductor 606 that functions as an electrode constituting a holding capacity. As for the pixel electrode 670, it is preferred to use a material such as a film comprised of Al or Ag as the main component, a laminated film thereof, and so on, which is superior in reflexivity.

By carrying out the steps described above, a CMOS circuit comprised of an N-channel type TFT 681 and a P-channel type TFT 682, a drive circuit 686 including an N-channel type TFT 683, and a pixel section 687 including a pixel TFT 684 and a holding capacity 685 are formed on the same substrate. Thus, an active matrix substrate is completed.

The N-channel type TFT 681 of the drive circuit 686 includes a channel forming area 637, the low density impurity area 636 (GOLD area), which overlaps with a first electrical conducting layer 628a constituting a part of the gate electrode, and a high density impurity area 652 that functions as the source area or the drain area. The P-channel type TFT 682 that constitutes the CMOS circuit being connected with N-channel type TFT 681 via an electrode 666 includes a channel forming area 640, the high density impurity area 653 that functions as the source area or the drain area and the impurity area 654 introduced with an impurity element imparting N-type and an impurity element imparting P-type. Further, the N-channel type TFT 683 includes a channel forming area 643, the low density impurity area 642 (GOLD area), which overlaps with a first conductive layer 630a constituting a part of the gate electrode and a high density impurity area 656 that functions as the source area or the drain area.

The pixel TFT 684 of the pixel section includes a channel forming area 646, a low density impurity area 645 (LDD area) that is formed outside the gate electrode and a high density impurity area 658 that functions as the source area and the drain area. The island-like semiconductor that functions as an electrode of the holding capacity 685 is added with an impurity element imparting N-type and an impurity element imparting P-type. The holding capacity 685 is comprised of an electrode (laminated layers of 632a and 632b) using the insulating film 616 as the dielectric and an island-like semiconductor film.

In the pixel structure according to the Example 1, the end portion of the pixel electrode is disposed to overlap with the source wiring so that the space between the pixel electrodes is shielded without using any black matrix.

Example 2

In Example 2, a manufacturing method of a TFT using a laser irradiation method according to the invention will be described.

Figure 12A:
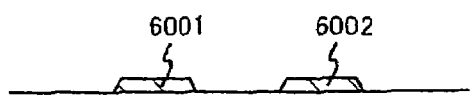
FIGS. 12A to 12L are illustrations showing a manufacturing method of a semiconductor device using a laser irradiation method according to the invention, which will be described in Embodiment 2.
Figure 12B:
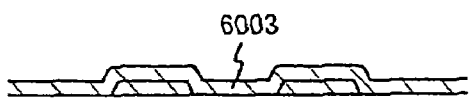

First of all, as shown in FIG. 12A, an amorphous semiconductor film is formed on an insulation surface, and then, the amorphous semiconductor film is subjected to an etching to form an island-like semiconductors 6001 and 6002. FIG. 12G is a top view of FIG. 12A, and a sectional view along the line A-A' is FIG. 12A. Then, as shown in FIG. 12B, an amorphous semiconductor film 6003 is formed to cover the island-like semiconductors 6001 and 6002. It is preferred that, immediately before forming the film, the film is subjected to rinse with diluted hydrofluoric acid to remove oxide film from the surface thereof, and then the amorphous semiconductor film 6003 is formed immediately. FIG. 12H is a top view of FIG. 12B, and a sectional view along the line A-A' is FIG. 12B.

Figure 12C:
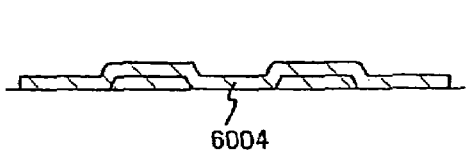
Figure 12D:
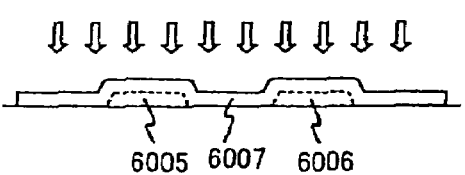

Next, as shown in FIG. 12C, by subjecting the amorphous semiconductor film 6003 to a patterning processing, a film 6004 of an island-like semiconductor film A, which covers the island-like semiconductors 6001 and 6002, is formed. FIG. 12I is a top view of FIG. 12C, and a sectional view along the line A-A' is FIG. 12C. Then, as shown in FIG. 12D, a laser beam is irradiated selectively to the film 6004 of the island-like semiconductor film A to increase the crystallinity. FIG. 12J is a top view of FIG. 12D, and a sectional view along the line A-A' is FIG. 12D.

Figure 12E:
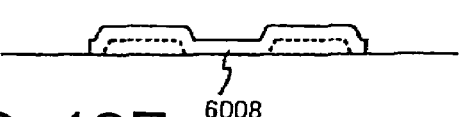
Figure 12F:
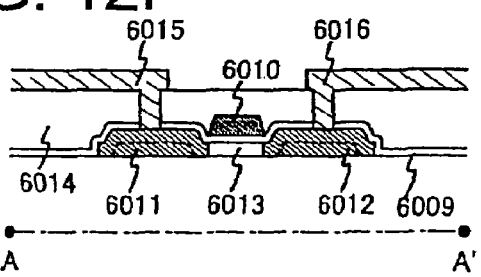
Figure 12G:
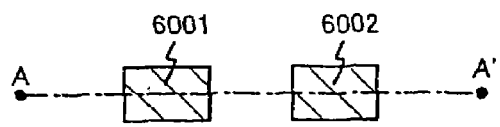
Figure 12H:
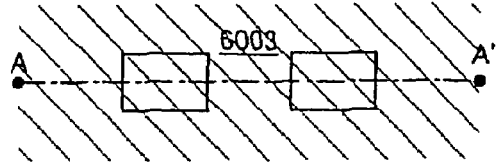
Figure 12I:
Figure 12J:
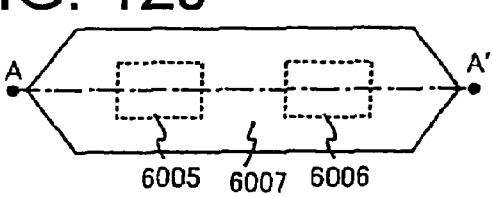
Figure 12K:
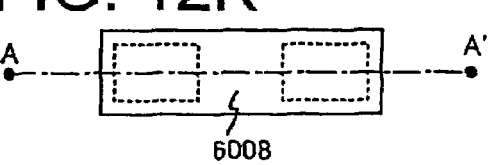
Figure 12L:
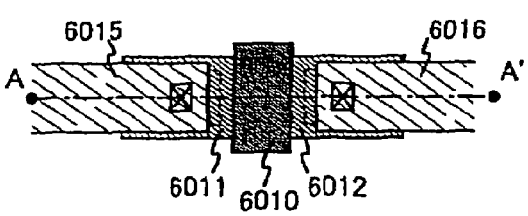

Next, as shown FIG. 12E, the film 6004 of the island-like semiconductor film A, which has been increased in crystallinity, is subjected to a patterning to form a film 6008 which will become an island-like semiconductor film B. FIG. 12K is a top view of FIG. 12E, and a sectional view along the line A-A' is FIG. 12E. Then, as shown FIG. 12F, a TFT, which uses the film 6008 of island-like semiconductor film B as the active layer, is formed. Although the following particular preparation processes may vary depending on the configuration of the TFT, typically, the following steps are carried out; i.e., a step in which a gate insulating film 6009 is formed so as to come in contact with the film 6008 of island-like semiconductor film B; a step in which a gate electrode 6010 is formed on the gate insulating film; a step in which impurity areas 6011 and 6012 and channel forming area 6013 are formed in the island 6008; a step in which an interlayer insulating film 6014 that covers the gate insulating film 6009, gate electrode 6010 and the island 6008; and a step in which wirings 6015 and 6016 that are connected with the impurity areas 6011 and 6012 are formed on interlayer insulating film 6014. FIG. 12L is a top view of FIG. 12F, and a sectional view along the line A-A' is FIG. 12F.

The thickness semiconductor film in the impurity areas 6011 and 6012 is adapted so as to be thicker than the thickness of the semiconductor film in channel forming area 6013. Since the sheet resistant of the impurity area can be reduced, it is preferred to obtain satisfactory transistor characteristics.

Example 3

Example 3 includes a process for crystallizing a semiconductor using a catalyst. Only the point, which is different from the Example 1, will be described. When a catalyst element is used, it is preferred to use the techniques, which are disclosed in Japanese Patent Laid-Open No. 7-130652 and in Japanese Patent Laid-Open No. 8-78329.

After forming the amorphous semiconductor film using Ni, the same is subjected to a solid-phase crystallization (hereinafter, the crystallization method will be referred to as NiSPC). For example, when the technique disclosed in Japanese Patent Laid-Open No. 7-130652, the amorphous semiconductor film is applied with solution of nickel acetate salt containing Nickel of 10 ppm in weight conversion to form a Nickel-containing layer, and after dehydrogenation processing for one hour at 500° C., the same is subjected to a heat treatment for 4-12 hours at 500-650° C.; for example, for 8 hours at 550° C., to crystallize the same. As for applicable catalyst element, in addition to Nickel (Ni), an element such as Germanium (Ge), iron (Fe), Palladium (Pd), Tin (Sn), lead (Pb), Cobalt (Co), platinum (Pt), copper (Cu), gold (Au) or the like may be used.

The process of applying the solution of nickel acetate salt and the heat treatment step may be carried out after the island-like semiconductor film A has been formed.

By means of laser irradiation method according to the invention, the crystallinity of the island-like semiconductor film A, which has been crystallized in a manner of NiSPC, is further increased. Since the polycrystalline semiconductor obtained by means of laser beam irradiation contains a catalyst element, a process (gettering) to remove the catalyst element from the crystalline semiconductor film is carried out after the laser crystallization. As for the gettering, the techniques disclosed in Japanese Patent Laid-Open No. 10-135468, Japanese Patent Laid-Open No. 10-135469 or the like are applicable.

In particular, to a part of the polycrystalline semiconductor, which is obtained after laser irradiation, phosphorous is added and is subjected to a heat treatment in a nitrogen atmosphere for 5-24 at a temperature of 550-800° C.; for example, for 12 hours at a temperature of 600° C. When applying the invention, it is preferred that, after adding the phosphorous to the semiconductor area other than island-like semiconductor film B, which will become the active layer of the TFT in the island-like semiconductor film A, the heat treatment is carried out.

Owing to this, the area added with the phosphorous in the polycrystalline semiconductor acts as a gettering site, the phosphorous resides in the polycrystalline semiconductor can be segregated in the area added with the phosphorous. Owing to this, it is possible to obtain the island-like semiconductor, in which the density of catalyst element in the channel area of the TFT has been reduced to less than $1 \times 10^{17}$ atoms/$cm^3$, preferably, to approximately $1 \times 10^{16}$ atoms/$cm^3$.

Example 4

In Example 4, a structure of a TFT, which is formed using a laser irradiation method according to the invention, will be described.

Figure 13A:
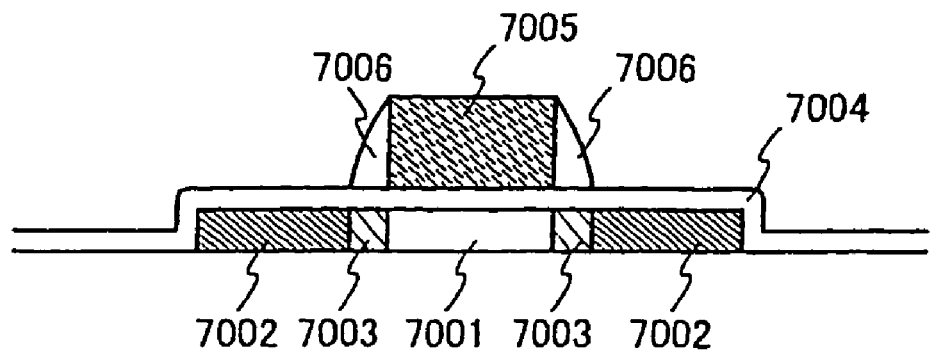
FIGS. 13A to 13C are illustrations showing a manufacturing method of a semiconductor device using a laser irradiation method according to the invention, which will be described in Embodiment 4.

A TFT shown in FIG. 13A includes a channel forming area 7001, first impurity areas 7002 sandwiching the channel forming area 7001 therebetween, and an active layer including second impurity areas 7003 sandwiched between the first impurity areas 7002 and the channel forming area 7001. And further, a gate insulating film 7004 abutting to the active layer and a gate electrode 7005 formed on the gate insulating film are included in the TFT. Side walls 7006 are formed so as to abut to the side faces of the gate electrode.

The side walls 7006 overlap with the second impurity areas 7003 being interposed with the gate insulating film 7004, and the same may be conductive or insulative. When the side walls 7006 are conductive, the same may be used as the gate electrodes including the side walls 7006.

Figure 13B:
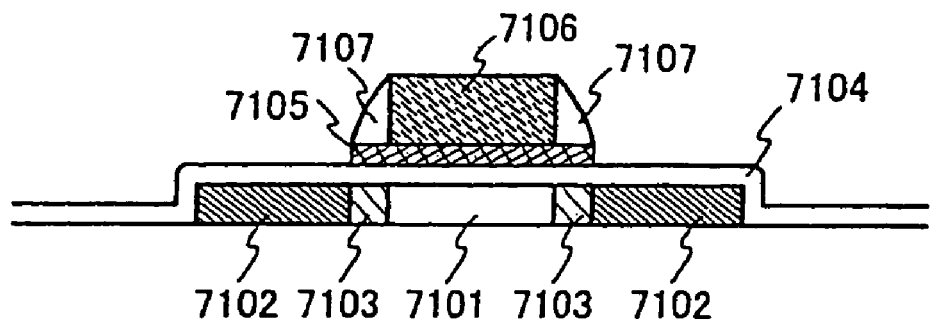

A TFT shown in FIG. 13B includes a channel forming area 7101, first impurity areas 7102 sandwiching the channel forming area 7101, and an active layer including second impurity areas 7103 sandwiched between the first impurity areas 7102 and the channel forming area 7101. And further, a gate insulating film 7104 abutting to the active layer and a gate electrode comprised of double-layered conductive films 7105 and 7106 built-up on the gate insulating film are included. Sidewalls 17107 is formed so as to abut to the upper surface of the conductive film 7105 and to the side surfaces of the conductive film 7106.

The side walls 7107 may be conductive or insulative. When the side walls 7107 are conductive, the same may be used as the gate electrodes including the side walls 7106.

Figure 13C:
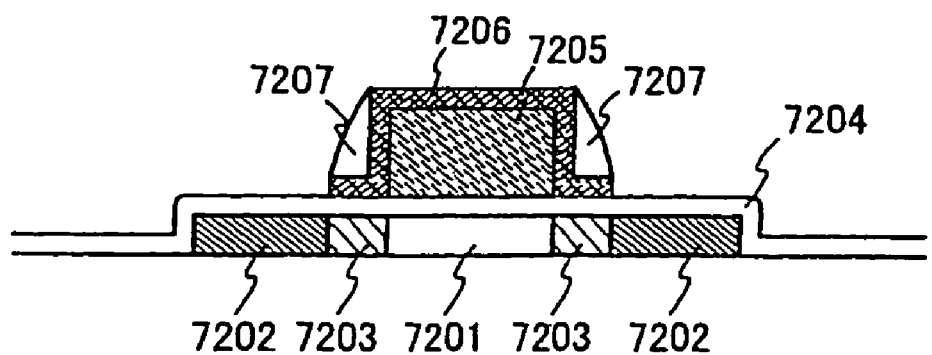

A TFT shown in FIG. 13C includes a channel forming area 7201, first impurity areas 7202 sandwiching the channel forming area 7201, and an active layer including second impurity areas 7203 formed between the first impurity areas 7202 and the channel forming area 7201. And further, a gate insulating film 7204 abutting to the active layer, a conductive film 7205 on the gate insulating film, a conductive film 7206 covering the upper surface and the side surfaces of the conductive film 7205 and side walls 7207 abutting to the side surfaces of the conductive film 7206 are formed. The conductive film 7205 and the conductive film 7206 function as the gate electrode.

The side walls 7207 may be conductive or insulative. When the side walls 7207 are conductive, the same may be used as the gate electrodes including the side walls 7207.

The Example 4 may be carried out in combination with any one of Examples 1-3.

As described above, according to the invention, it is possible to provide a manufacturing method of semiconductor device, which is capable of forming large crystal grains successively by means of artificially controlled super lateral growth, resulting in an increased substrate processing efficiency in the laser crystallization process, and which, unlike a conventional SLS method, uses a simple laser irradiation method without requiring a special optical system.

What is claimed is:

1. A method of manufacturing a semiconductor device comprising:
   forming a semiconductor layer over a substrate; and
   irradiating a pulse laser beam to said semiconductor layer to perform a lateral growth of said semiconductor layer,
   wherein said pulse laser beam has a pulse width of 50 ns or more, and
   wherein attenuation area width from peak position of an optical power of said pulse laser beam to a point where the power decreases to 50% is 10 μm or less.

2. A method according to claim 1 wherein said pulse laser beam is a second harmonic.

3. A method according to claim 1 wherein said pulse laser beam is a third harmonic.

4. A method according to claim 1 wherein said pulse laser beam is a fourth harmonic.

5. A method according to claim 1 wherein said pulse laser beam is outputted from a solid-state laser.

6. A method according to claim 1 wherein said pulse laser beam is outputted from a solid-state laser selected from YAG laser, $YVO_4$ laser, YLF laser, $YAlO_3$ laser, glass laser, ruby laser, alexandrite laser, Ti:sapphire laser, forsterite laser and Nd:YLF laser.

7. A method according to claim 1 wherein a beam position of said pulse laser beam over a surface of said semiconductor layer shifts for a distance of 0.3 μm or more and 5 μm or less at every pulse oscillation.

8. A method according to claim 7 wherein an angle, which is formed by a central axis in a longitudinal direction of said pulse laser beam and a shift direction of said pulse laser beam is orthogonal.

9. A method of manufacturing a semiconductor device comprising:
   forming a semiconductor layer over a substrate; and
   irradiating a pulse laser beam to said semiconductor layer selectively in a position specified by data of a mask for patterning said semiconductor layer to perform a lateral growth of said semiconductor layer,
   wherein said pulse laser beam has a pulse width of 50 ns or more, and
   wherein attenuation area width from peak position of an optical power of said pulse laser beam to a point where the power decreases to 50% is 10 μm or less.

10. A method according to claim 9 wherein said pulse laser beam is a second harmonic.

11. A method according to claim 9 wherein said pulse laser beam is a third harmonic.

12. A method according to claim 9 wherein said pulse laser beam is a fourth harmonic.

13. A method according to claim 9 wherein said pulse laser beam is outputted from a solid-state laser.

14. A method according to claim 9 wherein said pulse laser beam is outputted from a solid-state laser selected from YAG laser, $YVO_4$ laser, YLF laser, $YAlO_3$ laser, glass laser, ruby laser, alexandrite laser, Ti:sapphire laser, forsterite laser and Nd:YLF laser.

15. A method according to claim 9 wherein a beam position of said pulse laser beam over a surface of said semiconductor layer shifts for a distance of 0.3 μm or more and 5 μm or less at every pulse oscillation.

16. A method according to claim 15 wherein an angle, which is formed by a central axis in a longitudinal direction of said pulse laser beam and a shift direction of said pulse laser beam is orthogonal.

17. A method of manufacturing a semiconductor device comprising:
   forming a semiconductor layer over a substrate; and
   patterning said semiconductor layer into a first island-like semiconductor layer including a second island-like semiconductor layer to become an active layer of a thin film transistor in accordance with a layout information of said thin film transistor;
   irradiating a pulse laser beam to said first island-like semiconductor layer to perform a lateral growth of said first island-like semiconductor layer; and
   etching a peripheral area of said first island-like semiconductor layer to form said second island-like semiconductor layer to become said active layer of said thin film transistor,
   wherein said pulse laser beam has a pulse width of 50 ns or more, and
   wherein attenuation area width from peak position of an optical power of said pulse laser beam to a point where the power decreases to 50% is 10 μm or less.

18. A method according to claim 17 wherein said pulse laser beam is a second harmonic.

19. A method according to claim 17 wherein said pulse laser beam is a third harmonic.

20. A method according to claim 17 wherein said pulse laser beam is a fourth harmonic.

21. A method according to claim 17 wherein said pulse laser beam is outputted from a solid-state laser.

22. A method according to claim 17 wherein said pulse laser beam is outputted from a solid-state laser selected from YAG laser, $YVO_4$ laser, YLF laser, $YAlO_3$ laser, glass laser, ruby laser, alexandrite laser, Ti:sapphire laser, forsterite laser and Nd:YLF laser.

23. A method according to claim 17 wherein a beam position of said pulse laser beam over a surface of said first island-like semiconductor layer shifts for a distance of 0.3 μm or more and 5 μm or less at every pulse oscillation.

24. A method according to claim 23 wherein an angle, which is formed by a central axis in a longitudinal direction of said pulse laser beam and a shift direction of said pulse laser beam is orthogonal.

* * * * *